(12) United States Patent
Clark et al.

(10) Patent No.: US 8,787,086 B1
(45) Date of Patent: Jul. 22, 2014

(54) INHIBITING ADDRESS TRANSITIONS IN UNSELECTED MEMORY BANKS OF SOLID STATE MEMORY CIRCUITS

(75) Inventors: Lawrence T. Clark, Phoenix, AZ (US); Giby Samson, Austin, TX (US)

(73) Assignee: The Arizona Board of Regents for and on behalf of Arizona State University, Scottsdale, AZ (US)

( * ) Notice: Subject to any disclaimer, the term of this patent is extended or adjusted under 35 U.S.C. 154(b) by 442 days.

(21) Appl. No.: 12/551,045

(22) Filed: Aug. 31, 2009

Related U.S. Application Data

(60) Provisional application No. 61/092,767, filed on Aug. 29, 2008.

(51) Int. Cl.
*G11C 11/34* (2006.01)
*G11C 8/00* (2006.01)

(52) U.S. Cl.
USPC ............. 365/185.11; 365/230.03; 365/233.1

(58) Field of Classification Search
USPC ............. 365/185.11, 230.06, 230.01–230.03, 365/233.1
See application file for complete search history.

(56) References Cited

U.S. PATENT DOCUMENTS

| | | | | |
|---|---|---|---|---|
| 5,699,315 | A * | 12/1997 | Ko | 365/230.03 |
| 6,327,180 | B2 * | 12/2001 | Taura et al. | 365/185.09 |
| 6,466,507 | B2 * | 10/2002 | Ryan | 365/189.15 |
| 2005/0275430 | A1 * | 12/2005 | Kim et al. | 326/81 |
| 2007/0008809 | A1 * | 1/2007 | Kim | 365/233 |
| 2007/0242556 | A1 * | 10/2007 | Harada | 365/233 |
| 2009/0196102 | A1 * | 8/2009 | Kim | 365/185.11 |
| 2010/0257332 | A1 * | 10/2010 | Janzen et al. | 711/167 |
| 2012/0155143 | A1 * | 6/2012 | Choi | 365/72 |

OTHER PUBLICATIONS

Mizuno, H. et al., "Driving Source-line Cell Architecture for sub-1V, High-speed, Low-power Applications," IEEE J. Solid State Circuits, Mar. 1996, vol. 31, No. 4, pp. 552-557.
Zhang. K., et al., "SRAM Design on 65-nm CMOS Technology with Dynamic Sleep Transistor for Leakage Reduction," IEEE J. Solid State Circuits, Apr. 2005, vol. 40, No. 4, pp. 895-901.
Nambu, H. et al., "A 1.8-ns access, 550 MHz, 4.5 Mb CMOS SRAM," IEEE J. Solid-state Circuits, Nov. 1998, .vol. 33, No. 11, pp. 1650-1658.
Fetzer, E. et al., A Fully-Bypassed 6-issue Integer Datapath and Register File on an Itanium Microporcessor, Feb. 2002, IEEE ISSCC Dig., pp. 420-421.
Amrutur, B. et al., "Fast, Low-power Decoders for RAMs," IEEE J Solid-State Circuits, Oct. 2001, vol. 36, No. 10, pp. 1506-1515.
Mai, K., et al., "Low-power SRAM Design Using Half-swing Pulse-mode Techniques," IEEE J. Solid-state Circuits, Nov. 1998, vol. 33, No. 11, pp. 1659-1671.
Thompson, S., et al., "MOS Scaling: Transistor Challenges for the 21st Century," Intel Technology Journal, 1998, Q3, p. 1-15.

(Continued)

*Primary Examiner* — Tuan T Nguyen
*Assistant Examiner* — Khamdan Alrobaie
(74) *Attorney, Agent, or Firm* — Withrow & Terranova, P.L.L.C.

(57) ABSTRACT

The present disclosure relates to inhibiting address transitions in unselected memory banks of solid state memory circuits. Bank selection and address gating circuitry may be used to provide a set of gated address signals to decode circuitry for each memory bank, such that the gated address signals associated with unselected memory banks are prevented from transitioning and the gated address signals associated with a selected memory bank are based on clocking in the status of address signals provided by memory control circuitry.

20 Claims, 14 Drawing Sheets

(56) References Cited

OTHER PUBLICATIONS

Haigh, J., et al, "A Low Power 2.5 GHz 90 nm Level 1 Cache and Memory Management Unit," IEEE J. Solid-state Circuits, May 2005, vol. 40, pp. 1190-1199.

Amrutur, B. et al., "A replica technique for wordline and sense control in low power SRAM's," IEEE J. Solid-state Circuits, Aug. 1998, vol. 33, No. 8, pp. 1208-1219.

Hamzaoglu, F., et al., 'Analysis of dual-VT SRAM cells with full-Swing single-ended bit line sensing for on-chip cache,' IEEE Trans. VLSI Syst., Mar. 2002, vol. 10, No. 2, pp. 91-95.

Montanaro, J., et al, "A 160-MHz, 32-b, 0.5-W CMOS RISC microprocessor," IEEE J. Solid-state Circuits, Nov. 1996, vol. 31, No. 11, pp. 1703-1714.

Roy, K., et al., "Leakage current mechanisms and leakage reduction techniques in deep-submicrometer CMOS circuits," Proc. IEEE, Feb. 2003, vol. 91, No. 2, pp. 366-374.

Duarte, D., et al, "Evaluating the impact of architectural-level optimizations on clock power," Proc. ASIC/SOC Conf., Sep. 2001, pp. 447-451.

Kandemir, M., "Impact of data transformations on memory bank locality," Proc. Date, Feb. 2004, vol. 1, pp. 506-511.

Zhang, W., et al., "Compiler-directed instruction cache leakage optimization," Proc. Micro-35, Nov. 2002, pp. 208-218.

Bellas, N., et al., "Architectural and compiler techniques for energy reduction in high-performance microprocessors," IEEE Trans. VLSI Jun. 2000 Syst., vol. 8, No. 3, pp. 317-326.

Sutherland, I., et al., "Logical Effort: Designing Fast CMOS circuits," 1999, pp. 32-35, Morgan Kauffmann, San Francisco, CA.

Weste, N., et al., "CMOS VLSI Design: A Circuits and Systems Perspective," 3rd ed., 2005, pp. 180-183, 332-343, Addison-Wesley, NY.

Ito, K., "VLSI Memory Chip Design," 2001, pp. 440-443, 448-449, 454-455, 462-463, Springer-Verlag, Berlin.

\* cited by examiner

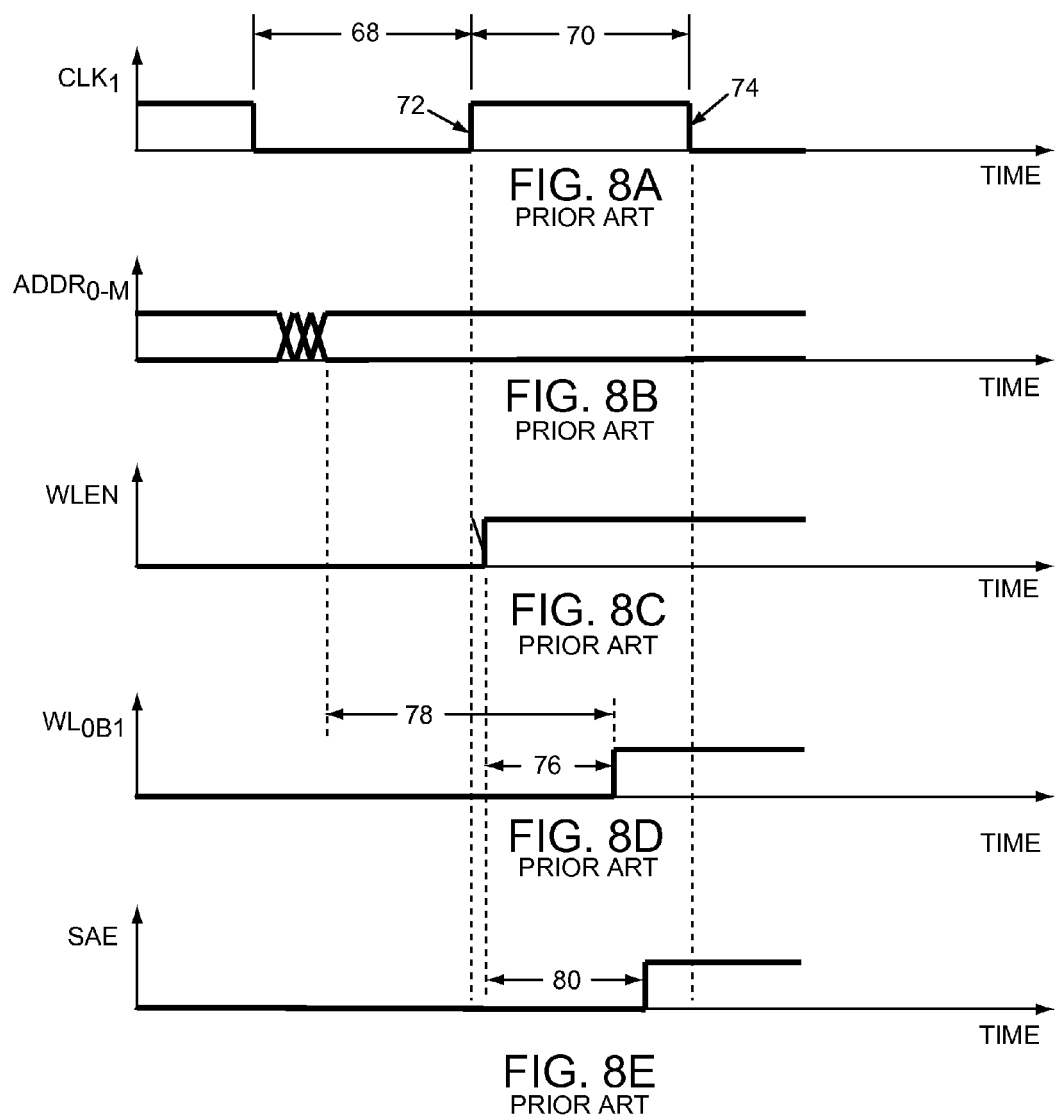

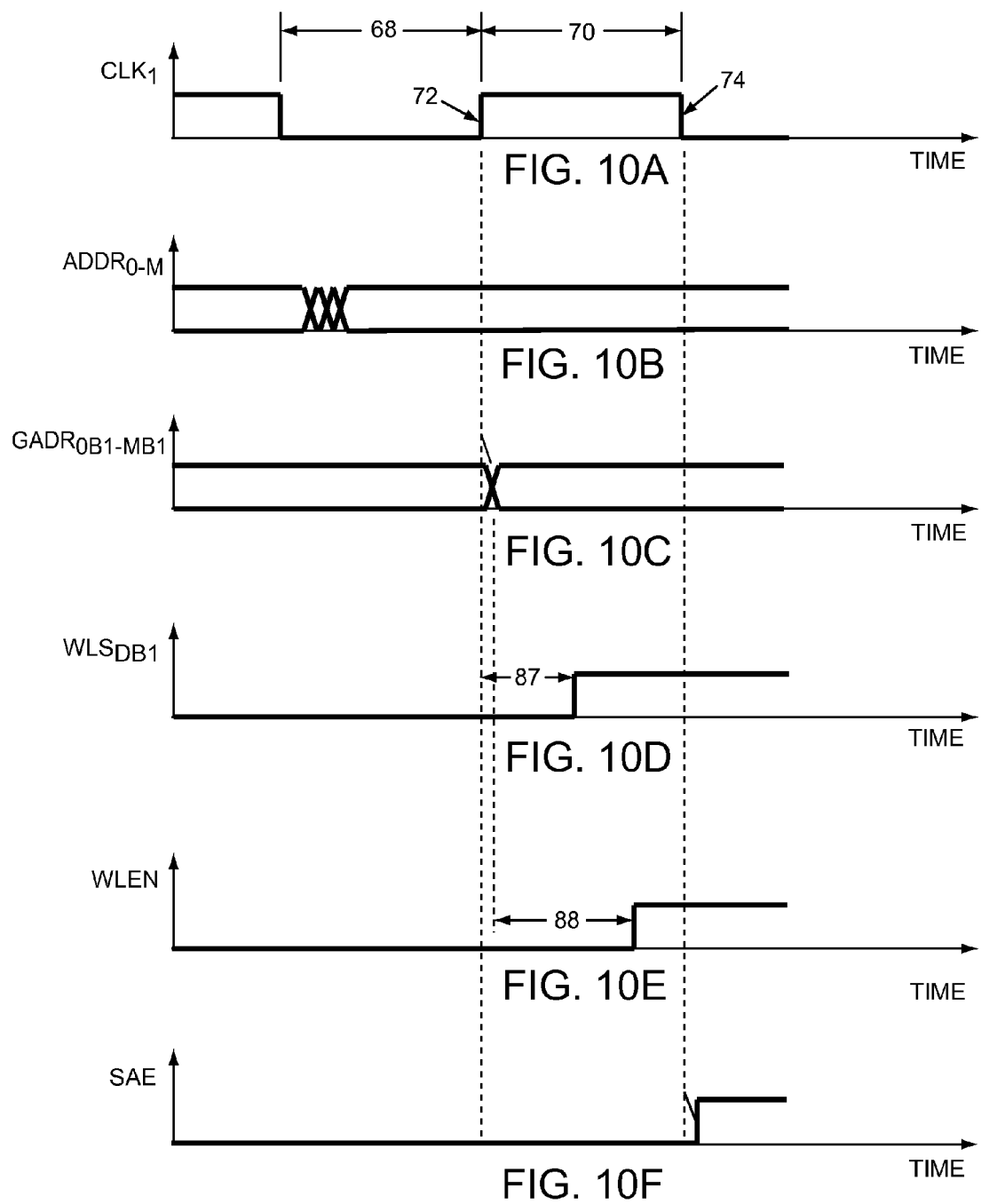

US 8,787,086 B1

INHIBITING ADDRESS TRANSITIONS IN UNSELECTED MEMORY BANKS OF SOLID STATE MEMORY CIRCUITS

This application claims the benefit of provisional patent application Ser. No. 61/092,767, filed Aug. 29, 2008, the disclosure of which is hereby incorporated herein by reference in its entirety.

FIELD OF THE DISCLOSURE

Embodiments of the present disclosure relate to solid state memory circuits and decoders for solid state memory circuits.

BACKGROUND OF THE DISCLOSURE

As circuit geometries become increasingly smaller and clock rates become increasingly higher, power dissipation in digital circuits is a parameter that must be kept under control. Higher clock rates, higher leakage currents associated with smaller geometries, and higher circuit densities all drive toward higher power densities, which must be addressed using power dissipation methods, such as larger heat sinks, to avoid degradation in reliability. A further challenge is proliferation of portable, battery powered devices, which are evolving toward reduced size and weight, and have limited available power and limited room for heat sinks. Therefore, techniques to reduce power consumption in digital circuits are becoming increasingly important.

Additionally, as application software becomes more sophisticated and complex, demand for larger memory sizes is increasing. As a result, solid state memory circuits are becoming larger and may occupy a large portion of a digital circuit design. Larger memory sizes require more decoding circuitry to provide decoded memory access signals to individual memory blocks. As such, higher clock rates may place significant timing demands on decoding circuitry, which may become increasingly complex with larger memory sizes. The timing demands may place limitations on maximum allowable timing delays in the decoding circuitry for proper memory circuit operation. Thus, there is a need to reduce power consumption in solid state memory circuits and to reduce timing delays in the decoding circuitry associated with solid state memory circuits.

SUMMARY OF THE EMBODIMENTS

The present disclosure relates to inhibiting address transitions in unselected memory banks of solid state memory circuits, which may conserve power. Memory bank selection and address gating circuitry may be used to provide a set of gated address signals to decode circuitry for each memory bank, such that the gated address signals associated with unselected memory banks are prevented from transitioning and the gated address signals associated with a selected memory bank are based on clocking in the status of address signals provided by memory control circuitry. In some embodiments of the present disclosure, the bank selection and address gating circuitry may include dynamic circuitry to reduce access times, reduce leakage currents, or both. Further, by using dynamic circuitry, sense timing circuits having critical timing race constraints, which are used in conventional decode circuits, may be replaced with sense timing circuits that are clocked from two different clock edges, thereby eliminating the critical timing race constraints. By combining address transition inhibiting circuitry and dynamic circuitry, an energy consumption-delay product may be reduced and leakage power dissipation may be substantially reduced.

In some embodiments of the present disclosure, memory bank selection may be based on higher order address bits. Further, the Bank selection and address gating circuitry may include bank pre-decode circuits and address driver circuits. The address driver circuits provide the gated address signals to the decode circuitry for each memory bank and the bank pre-decode circuits provide clock signals to the address driver circuits. The clock signals provided to the address driver circuits that are associated with unselected memory banks are prevented from transitioning and the clock signals to the address driver circuits that are associated with a selected memory bank are allowed to transition. The address driver circuits may include dynamic circuitry, dynamic domino circuitry, differential dynamic circuitry, differential dynamic domino circuitry, or any combination thereof. Additionally, the bank pre-decode circuits may include dynamic circuitry, dynamic domino circuitry, differential dynamic circuitry, differential dynamic domino circuitry, or any combination thereof. The present disclosure relates to solid state memory circuits, which may include static random access memory (SRAM) circuits, dynamic random access memory (DRAM) circuits, flash memory circuits, read only memory (ROM) circuits, or the like.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 8A through 8E are graphs illustrating timing relationships between signals associated with the partial conventional decode circuitry and the conventional decode circuitry illustrated in FIG. 7 and FIG. 3, respectively.

FIGS. 10A through 10F are graphs illustrating timing relationships between signals associated with the partial decode circuit and the first memory bank decode circuit illustrated in FIG. 9A and FIG. 5, respectively.

DETAILED DESCRIPTION OF THE PREFERRED EMBODIMENTS

Figure 1:
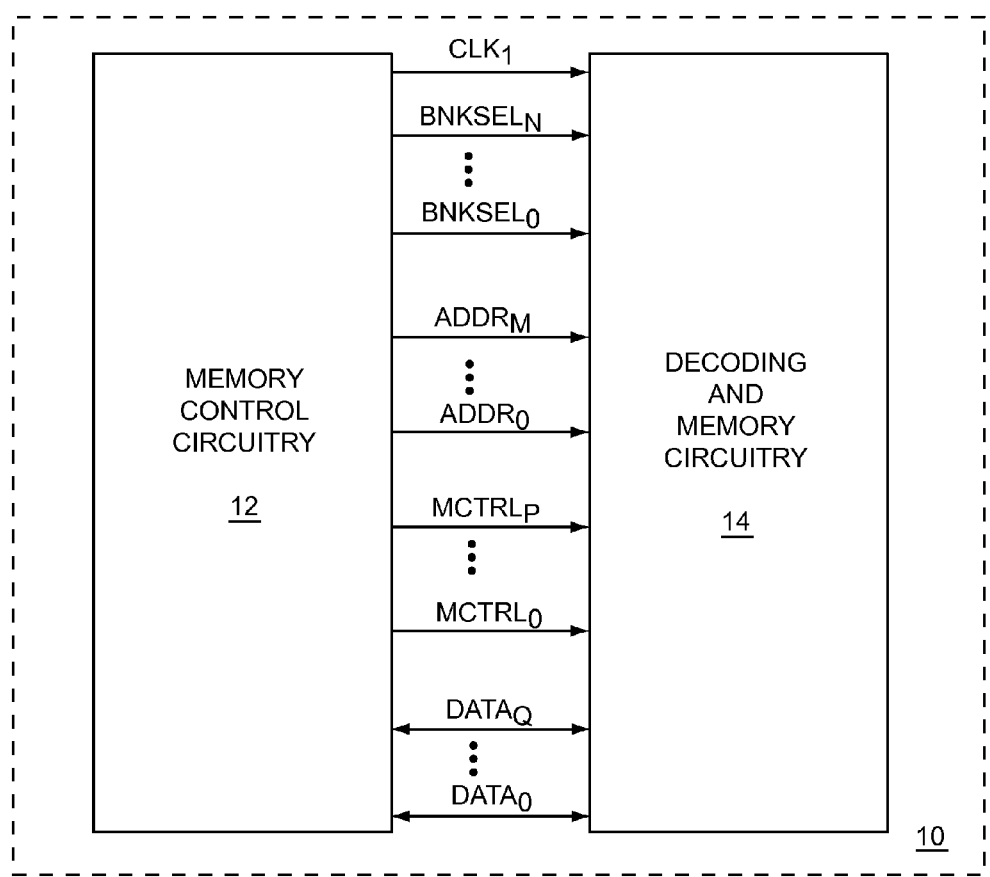
FIG. 1 shows computing circuitry, which includes memory control circuitry and decoding and memory circuitry according to one embodiment of the present disclosure.

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to inhibiting address transitions in unselected memory banks of solid state memory circuits to conserve power. Bank selection and address gating circuitry may be used to provide a set of gated address signals to decode circuitry for each memory bank, such that the gated address signals associated with unselected memory banks are prevented from transitioning and the gated address signals associated with a selected memory bank are based on clocking in the status of address signals provided by memory control circuitry. In some embodiments of the present disclosure, the bank selection and address gating circuitry may include dynamic circuitry to reduce access times, reduce leakage currents, or both. Further, by using the dynamic circuitry, sense timing circuits having critical timing race constraints, which are used in conventional decode circuits, may be replaced with sense timing circuits that are clocked from two different clock edges, thereby eliminating the critical timing race constraints. By combining address transition inhibiting circuitry and the dynamic circuitry, an energy consumption-delay product may be reduced and leakage power dissipation may be substantially reduced.

In some embodiments of the present disclosure, memory bank selection may be based on higher order address bits. Further, the memory bank selection and address gating circuitry may include bank pre-decode circuits and address driver circuits. The address driver circuits provide the gated address signals to the decode circuitry for each memory bank and the bank pre-decode circuits provide clock signals to the address driver circuits. The clock signals provided to the address driver circuits that are associated with unselected memory banks are prevented from transitioning and the clock signals to the address driver circuits that are associated with a selected memory bank are allowed to transition. The address driver circuits may include dynamic circuitry, dynamic domino circuitry, differential dynamic circuitry, differential dynamic domino circuitry, or any combination thereof. Additionally, the bank pre-decode circuits may include dynamic circuitry, dynamic domino circuitry, differential dynamic circuitry, differential dynamic domino circuitry, or any combination thereof. The present disclosure relates to solid state memory circuits, which may include static random access memory (SRAM) circuits, dynamic random access memory (DRAM) circuits, flash memory circuits, read only memory (ROM) circuits, or the like.

FIG. 1 shows computing circuitry 10, which includes memory control circuitry 12 and decoding and memory circuitry 14 according to one embodiment of the present disclosure. Many computing circuits require access to some form of memory to obtain instructions, save and retrieve data, or the like. The memory access may be associated with addressing signals to specify a particular memory location, data signals to receive and send data, control signals to initiate and specify a type of transaction, and timing signals to synchronize and facilitate operations. The decoding and memory circuitry 14 includes multiple memory cells arranged in separate memory banks. Each memory cell stores a single bit of information. The memory cells in each memory bank are arranged to provide multiple memory words, such that each memory word includes multiple bits that are provided by a group of memory cells. Typically, at least some of the bits of a memory word are accessed simultaneously.

The memory control circuitry 12 controls access to the memory cells in the decoding and memory circuitry 14. The memory control circuitry 12 provides a $0^{th}$ bank select signal $BNKSEL_0$ and up to and including an $N^{th}$ bank select signal $BNKSEL_N$ to the decoding and memory circuitry 14 to select a specific memory bank for a specific memory access. The memory control circuitry 12 provides a $0^{th}$ address signal $ADDR_0$ and up to and including an $M^{th}$ address signal $ADDR_M$ to the decoding and memory circuitry 14 to select a particular address in the specified memory bank for the specific memory access. The memory control circuitry 12 provides a $0^{th}$ memory control signal $MCTRL_0$ and up to and including a $P^{th}$ memory control signal $MCTRL_P$ to the decoding and memory circuitry 14 to initiate and control the type of memory access, such as a memory read or a memory write. The memory control circuitry 12 provides a first clock signal $CLK_1$ to the decoding and memory circuitry 14 for timing, synchronization, and to facilitate the specific memory access. A $0^{th}$ data signal $DATA_0$ and up to and including a $Q^{th}$ data signal $DATA_Q$ are bidirectional signals between the memory control circuitry 12 the decoding and memory circuitry 14 for transferring data associated with each memory access. In a memory read, data is transferred from the decoding and memory circuitry 14 to the memory control circuitry 12. In a memory write, data is transferred from the memory control circuitry 12 to the decoding and memory circuitry 14.

In one embodiment of the present disclosure, the memory control circuitry 12 provides a second group of address signals (not shown), which function as the bank select signals $BNKSEL_0$, $BNKSEL_N$. The second group of address signals may be high order address signals compared to the address signals $ADDR_0$, $ADDR_M$. The computing circuitry 10 illustrated in FIG. 1 is an exemplary embodiment of the present disclosure and not intended to limit the scope of the present disclosure. Alternate embodiments of the computing circuitry 10 may omit any or all of the signals shown in FIG. 1, may add other signals, or both.

Figure 2:
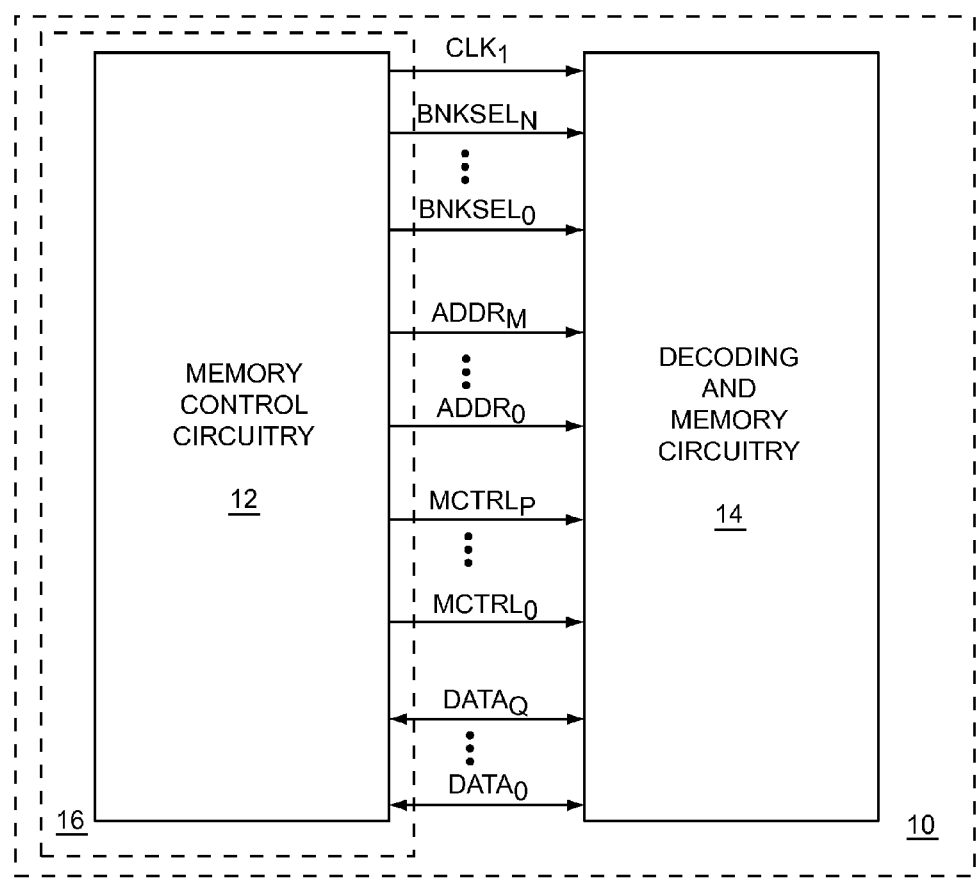
FIG. 2 shows the computing circuitry according to an alternate embodiment of the present disclosure.

FIG. 2 shows the computing circuitry 10 according to an alternate embodiment of the present disclosure. Microprocessor circuitry 16 includes the memory control circuitry 12. In other embodiments of the present disclosure, the microprocessor circuitry 16 may include the decoding and memory circuitry 14. Further, in some embodiments of the present disclosure, other types of digital circuitry may include the memory control circuitry 12, decoding and memory circuitry 14, or both instead of the microprocessor circuitry 16, such as mainframes, micro-controllers, mini-computers, digital signal processors, memory storage systems, programmable logic, the like, stand alone memory integrated circuits, or any combination thereof. The computing circuitry 10 illustrated in FIG. 2 is an exemplary embodiment of the present disclosure and not intended to limit the scope of the present disclosure.

Figure 3:
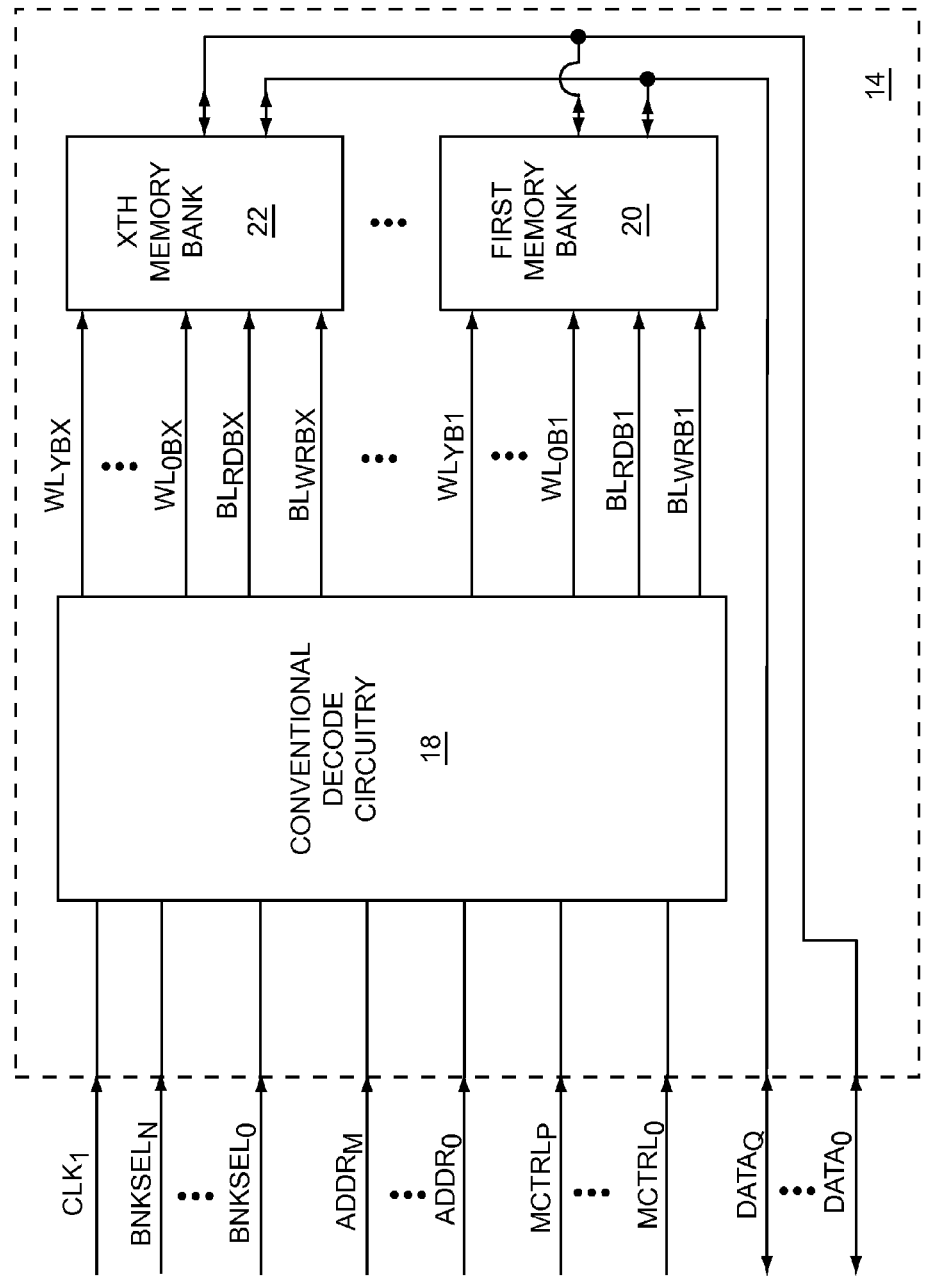
FIG. 3 shows details of the decoding and memory circuitry illustrated in FIG. 1 according to the prior art.

FIG. 3 shows details of the decoding and memory circuitry 14 illustrated in FIG. 1 according to the prior art. The decoding and memory circuitry 14 includes conventional decode circuitry 18, a first memory bank 20, and up to and including an Xth memory bank 22. The conventional decode circuitry 18 receives the first clock signal $CLK_1$, the $0^{th}$ bank select signal $BNKSEL_0$ and up to and including the $N^{th}$ bank select signal $BNKSEL_N$, the $0^{th}$ address signal $ADDR_0$ and up to and including the $M^{th}$ address signal $ADDR_M$, and the $0^{th}$ memory control signal $MCTRL_0$ and up to and including the $P^{th}$ memory control signal $MCTRL_P$. The conventional decode circuitry 18 provides a first memory bank, $0^{th}$ wordline $WL_{0B1}$ and up to and including a first memory bank, $Y^{th}$ wordline $WL_{YB1}$, a first memory bank, read bitline access signal $BL_{RDB1}$, and a first memory bank, write bitline access signal $BL_{WRB1}$ to the first memory bank 20, and up to and including an Xth memory bank, $0^{th}$ wordline $WL_{0BX}$ and up to and including an Xth memory bank, $Y^{th}$ wordline $WL_{YBX}$, an Xth memory bank, read bitline access signal $BL_{RDBX}$, and an Xth memory bank, write bitline access signal $BL_{WRBX}$ to the Xth memory bank 22. The $0^{th}$ data signal $DATA_0$ and up to and including the $Q^{th}$ data signal $DATA_Q$ are used to transfer data between the memory control circuitry 12 (FIG. 1) and the first memory bank 20 or up to and including the Xth memory bank 22.

For each memory access, the conventional decode circuitry 18 selects a memory bank that contains the memory cells associated with the memory location to be accessed based on the $0^{th}$ bank select signal $BNKSEL_0$ and up to and including the $N^{th}$ bank select signal $BNKSEL_N$. The conventional decode circuitry 18 decodes the memory address encoded in the $0^{th}$ address signal $ADDR_0$ and up to and including the $M^{th}$ address signal $ADDR_M$ to determine which specific wordline is associated with the memory location to be accessed. The conventional decode circuitry 18 determines whether the access is a read or a write, based on the $0^{th}$ memory control signal $MCTRL_0$ and up to and including the $P^{th}$ memory control signal $MCTRL_P$. Then, the conventional decode circuitry 18 asserts the specific wordline associated with the memory location to be accessed in the selected bank. Next, the conventional decode circuitry 18 asserts either the read bitline access signal or the write bitline access signal in the selected bank, depending on whether the memory access is a read or a write. If the memory access is a read, when the read bitline access signal is asserted, the memory cells associated with the asserted wordline output their contents onto read bitlines in the selected memory bank, which then outputs the contents using the $0^{th}$ data signal DATA) and up to and including the $Q^{th}$ data signal $DATA_Q$, which are received by the memory control circuitry 12 (FIG. 1). If the memory access is a write, the memory control circuitry 12 (FIG. 1) sends data to be written using the $0^{th}$ data signal $DATA_0$ and up to and including the $Q^{th}$ data signal $DATA_Q$. Then, when the write bitline access signal is asserted, the contents of the data from the $0^{th}$ data signal DATA and up to and including the $Q^{th}$ data signal $DATA_0$ are driven onto write bitlines in the selected memory bank, and the memory cells associated with the asserted wordline in the selected memory bank input the data from the write bitlines, thereby over-writing previous contents. Those skilled in the art will observe that the bitlines may serve for both reads and writes and that the memory bitlines may be differential, i.e., the logic value may be determined by their potential (voltage) difference.

Figure 4:
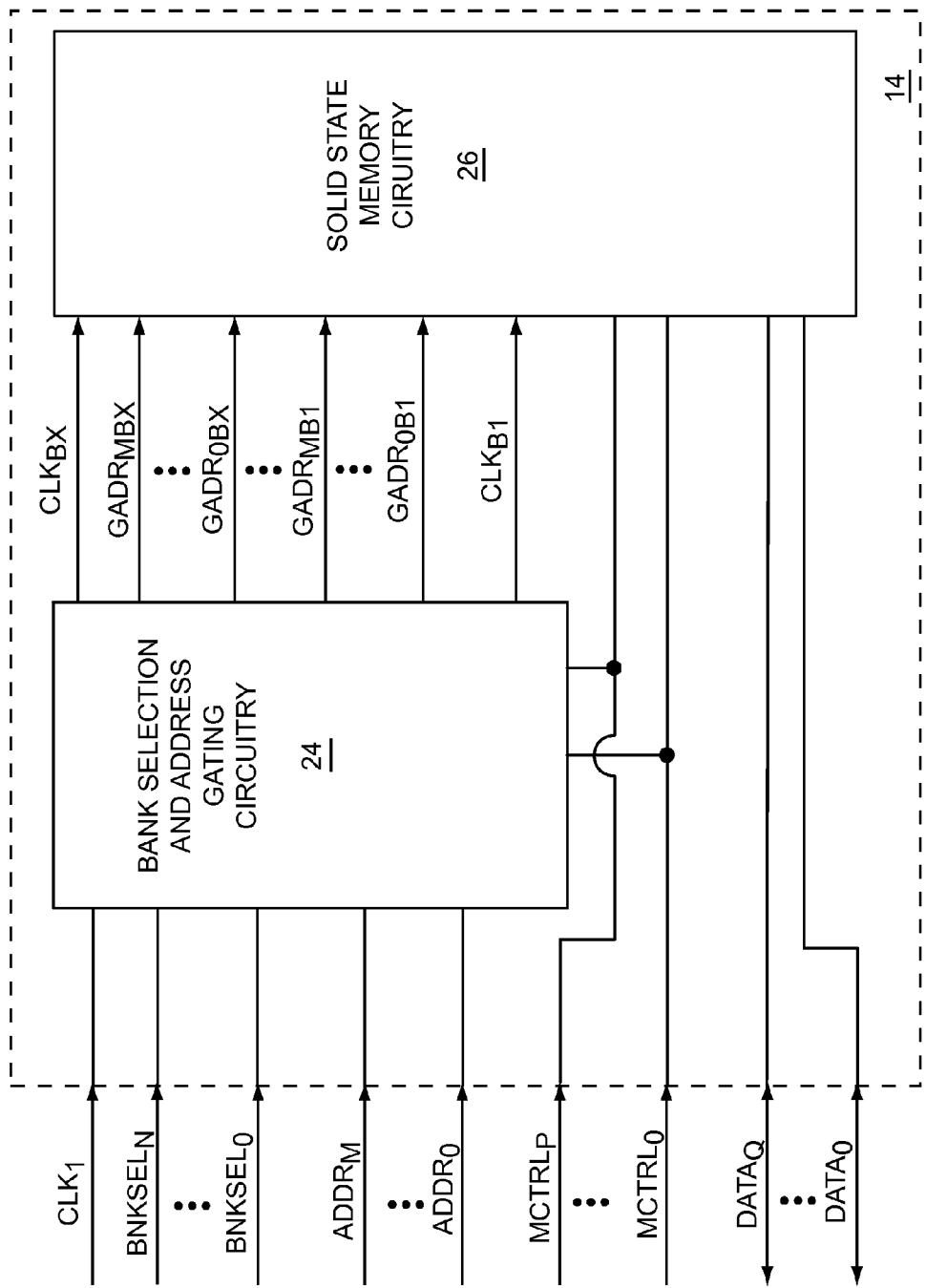
FIG. 4 shows details of the decoding and memory circuitry illustrated in FIG. 1 according to one embodiment of the present disclosure.

FIG. 4 shows details of the decoding and memory circuitry 14 illustrated in FIG. 1 according to one embodiment of the present disclosure. The decoding and memory circuitry 14 includes bank selection and address gating circuitry 24 and solid state memory circuitry 26. The solid state memory circuitry 26 includes multiple memory cells arranged in separate memory banks and memory address decode circuitry for decoding input addresses to provide access to the memory cells (not shown). The memory banks are associated with multiple memory accesses. The bank selection and address gating circuitry 24 receives the first clock signal $CLK_1$, the $0^{th}$ bank select signal $BNKSEL_0$ and up to and including the $N^{th}$ bank select signal $BNKSEL_N$, the $0^{th}$ address signal $ADDR_0$ and up to and including the $M^{th}$ address signal $ADDR_M$, and the $0^{th}$ memory control signal $MCTRL_0$ and up to and including the $P^{th}$ memory control signal $MCTRL_P$. The bank selection and address gating circuitry 24 provides a set of gated address signals for each memory bank in the solid state memory circuitry 26. Specifically, the bank selection and address gating circuitry 24 provides a first memory bank, $0^{th}$ gated address signal $GADR_{0B1}$ and up to and including a first memory bank, $M^{th}$ gated address signal $GADR_{MB1}$, and up to and including an Xth memory bank, $0^{th}$ gated address signal $GADR_{0BX}$ and up to and including an Xth memory bank, $M^{th}$ gated address signal $GADR_{MBX}$ to the solid state memory circuitry 26. The bank selection and address gating circuitry 24 provides a first memory bank clock signal $CLK_{B1}$ and up to and including an Xth memory bank clock signal $CLK_{BX}$ to the solid state memory circuitry 26. The solid state memory circuitry 26 receives the $0^{th}$ memory control signal $MCTRL_0$ and up to and including the $P^{TH}$ memory control signal $MCTRL_P$. The $0^{th}$ data signal $DATA_0$ and up to and including the $Q^{th}$ data signal $DATA_Q$ are used to transfer data between the memory control circuitry 12 (FIG. 1) and the solid state memory circuitry 26.

For each memory access, the bank selection and address gating circuitry 24 selects a memory bank that contains the memory cells associated with the memory location to be accessed based on the $0^{th}$ bank select signal $BNKSEL_0$ and up to and including the $N^{th}$ bank select signal $BNKSEL_N$. During each memory access, the bank selection and address gating circuitry 24 provides the memory address associated with the memory location to be accessed using the gated address signals associated with the selected memory bank based on the $0^{th}$ address signal $ADDR_0$ and up to and including the $M^{th}$ address signal $ADDR_M$. The gated address signals associated with all unselected memory banks are prevented from transitioning. By preventing transitioning of gated address signals associated with unselected memory banks, decoder movement in the solid state memory circuitry 26 associated with the unselected memory banks is avoided, thereby conserving power. For example, during a memory access to a first memory bank in the solid state memory circuitry 26, the first memory bank, $0^{th}$ gated address signal $GADR_{0B1}$ and up to and including the first memory bank, $M^{th}$ gated address signal $GADR_{MB1}$ reflect an address based on the $0^{th}$ address signal $ADDR_0$ and up to and including the $M^{th}$ address signal $ADDR_M$. All of the remaining gated address signals, which include up to and including the Xth memory bank, $0^{th}$ gated address signal $GADR_{OBX}$ and up to and including the Xth memory bank, $M^{th}$ gated address signal $GADR_{MBX}$ do not transition during the memory access.

During each memory access, the memory bank clock signal of the first memory bank clock signal $CLK_{B1}$ and up to and including the Xth memory bank clock signal $CLK_{BX}$ that is associated with the selected memory bank is based on the first clock signal $CLK_1$. All memory bank clock signals associated with unselected memory banks are prevented from transitioning. In an alternate embodiment of the present disclosure, the first memory bank clock signal $CLK_{B1}$ and up to and including the Xth memory bank clock signal $CLK_{BX}$ are omitted. Instead, the solid state memory circuitry 26 receives the first clock signal $CLK_1$ for needed functions. The solid state memory circuitry 26 may include SRAM circuits, DRAM circuits, flash memory circuits, ROM circuits, programmable ROM (PROM) circuits, erasable PROM (EPROM) circuits, electrically erasable PROM (EEPROM) circuits, the like, or any combination thereof. The decoding and memory circuitry 14 illustrated in FIG. 4 is an exemplary embodiment of the present disclosure and not intended to limit the scope of the present disclosure. Alternate embodiments of the decoding and memory circuitry 14 may omit any or all of the signals shown in FIG. 4, may add other signals, or both.

Figure 5:
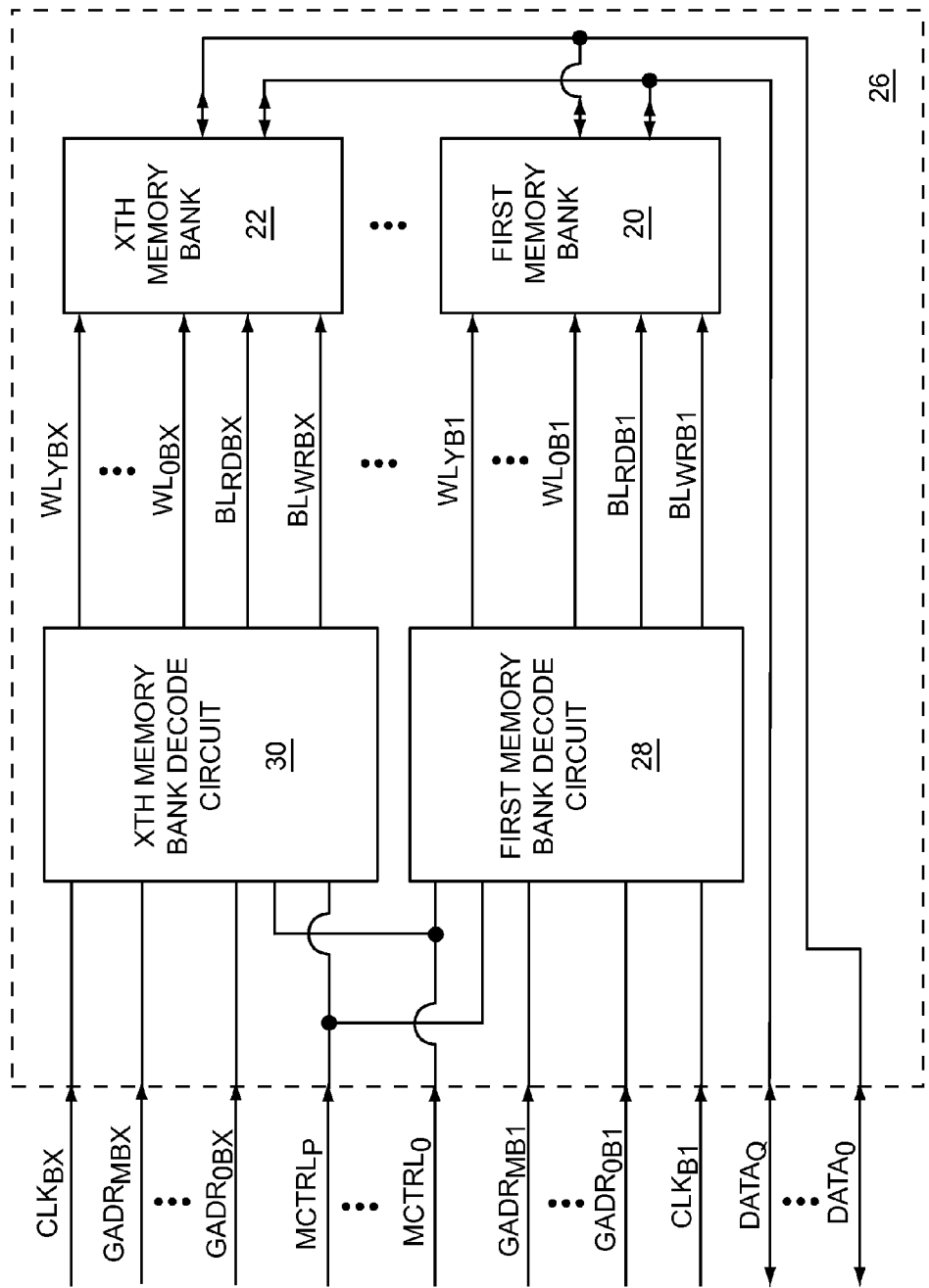
FIG. 5 shows details of solid state memory circuitry illustrated in FIG. 4 according to one embodiment of the solid state memory circuitry.

FIG. 5 shows details of the solid state memory circuitry 26 illustrated in FIG. 4 according to one embodiment of the solid state memory circuitry 26. The solid state memory circuitry 26 includes a first memory bank decode circuit 28 and up to and including an Xth memory bank decode circuit 30, and the first memory bank 20 and up to and including the Xth memory bank 22. The first memory bank decode circuit 28 receives the first memory bank clock signal $CLK_{B1}$, the first memory bank, $0^{th}$ gated address signal $GADR_{OB1}$ and up to and including the first memory bank, $M^{th}$ gated address signal $GADR_{MB1}$, and the $0^{th}$ memory control signal $MCTRL_0$ and up to and including the $P^{th}$ memory control signal $MCTRL_P$. The first memory bank decode circuit 28 provides the first memory bank, $0^{th}$ wordline $WL_{OB1}$ and up to and including the first memory bank, $Y^{th}$ wordline $WL_{YB1}$, the first memory bank, read bitline access signal $BL_{RDB1}$, and the first memory bank, write bitline access signal $BL_{WRB1}$ to the first memory bank 20. The Xth memory bank decode circuit 30 receives the Xth memory bank clock signal $CLK_{BX}$, the Xth memory bank, $0^{th}$ gated address signal $GADR_{OBX}$ and up to and including the Xth memory bank, $M^{th}$ gated address signal $GADR_{MBX}$, and the $0^{th}$ memory control signal $MCTRL_0$ and up to and including the $P^{th}$ memory control signal $MCTRL_P$. The Xth memory bank decode circuit 30 provides the Xth memory bank, $0^{th}$ wordline $WL_{OBX}$ and up to and including the Xth memory bank, $Y^{th}$ wordline $WL_{YBX}$, the Xth memory bank, read bitline access signal $BL_{RDBX}$, and the Xth memory bank, write bitline access signal $BL_{WRBX}$ to the Xth memory bank 22. The $0^{th}$ data signal $DATA_0$ and up to and including the $Q^{th}$ data signal $DATA_Q$ are used to transfer data between the memory control circuitry 12 (FIG. 1) and the first memory bank 20 and up to and including the Xth memory bank 22.

During each memory access, only one of the first memory bank decode circuit 28 and up to and including an Xth memory bank decode circuit 30 is active, depending on the selected memory bank. For example, if the selected memory bank is the first memory bank 20, the first memory bank decode circuit 28 decodes the memory address encoded in the first memory bank, $0^{th}$ gated address signal $GADR_{OB1}$ and up to and including the first memory bank, $M^{th}$ gated address signal $GDDR_{MB1}$ to determine which specific wordline is associated with the memory location to be accessed. The first memory bank decode circuit 28 determines whether the access is a read or a write based on the $0^{th}$ memory control signal $MCTRL_0$ and up to and including the $P^{th}$ memory control signal $MCTRL_P$. Then, the first memory bank decode circuit 28 asserts the specific wordline associated with the memory location to be accessed in the first memory bank 20. Next, the first memory bank decode circuit 28 asserts either the read bitline access signal or the write bitline access signal in the first memory bank 20, depending on whether the memory access is a read or a write. If the memory access is a read, when the read bitline access signal is asserted, the memory cells associated with the asserted wordline output their contents onto read bitlines in the first memory bank 20, which then outputs the contents using the $0^{th}$ data signal $DATA_0$ and up to and including the $Q^{th}$ data signal $DATA_Q$, which are received by the memory control circuitry 12 (FIG. 1). If the memory access is a write, the memory control circuitry 12 (FIG. 1) sends data to be written using the $0^{th}$ data signal $DATA_0$ and up to and including the $Q^{th}$ data signal $DATA_Q$. Then, when the write bitline access signal is asserted, the contents of the data from the $0^{th}$ data signal $DATA_0$ and up to and including the $Q^{th}$ data signal $DATA_Q$ are driven onto write bitlines in the first memory bank 20, and the memory cells associated with the asserted wordline in the first memory bank 20 input the data from the write bitlines, thereby over-writing previous contents. The solid state memory circuitry 26 illustrated in FIG. 5 is an exemplary embodiment of the present disclosure and not intended to limit the scope of the present disclosure. Alternate embodiments of the solid state memory circuitry 26 may omit any or all of the signals shown in FIG. 5, may add other signals, may omit any or all of the circuitry shown in FIG. 5, may add other circuitry, or any combination thereof.

Figure 6:
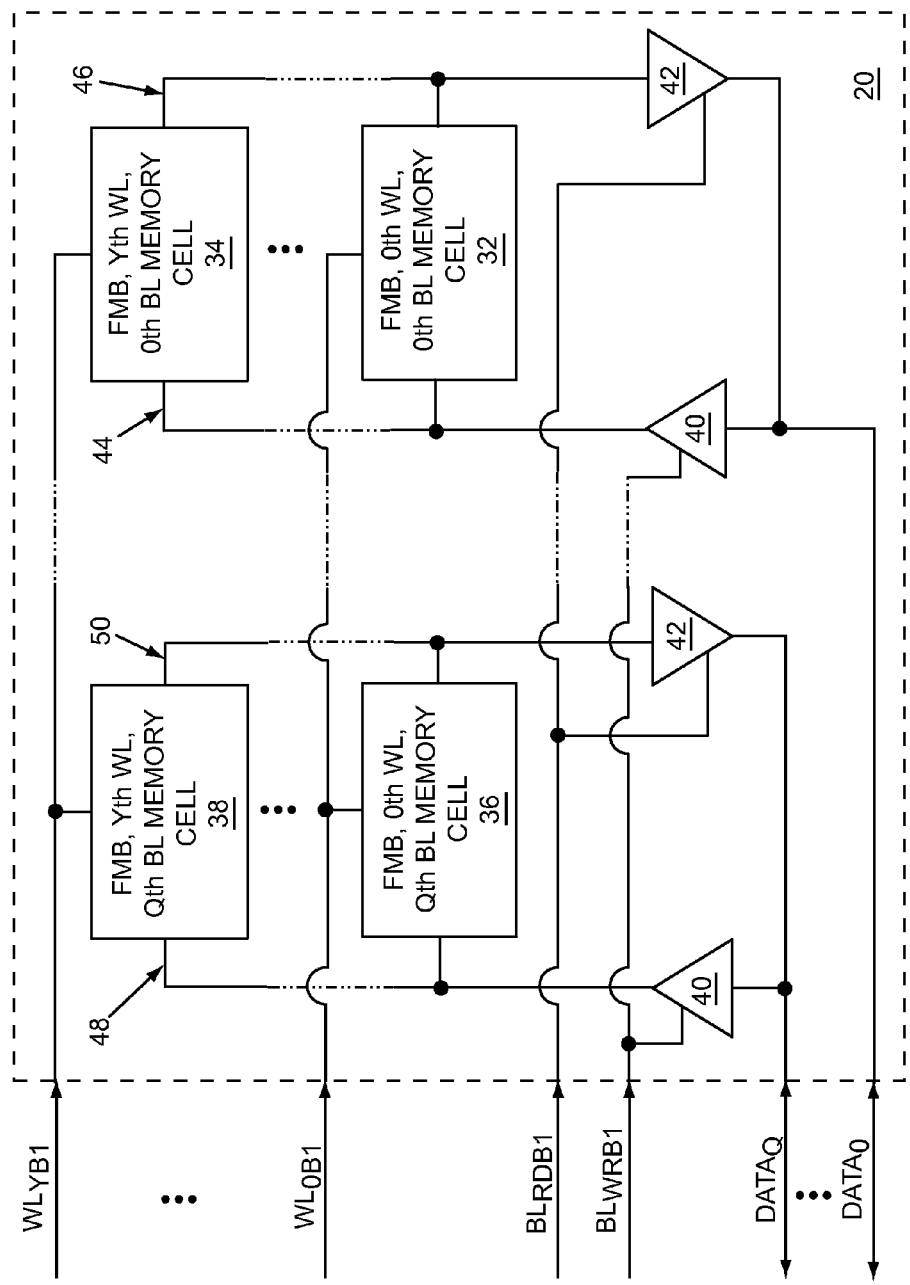
FIG. 6 shows details of a first memory bank illustrated in FIG. 5 according to one embodiment of the first memory bank.

FIG. 6 shows details of the first memory bank 20 illustrated in FIG. 5 according to one embodiment of the first memory bank 20. The first memory bank 20 includes a first memory bank, $0^{th}$ wordline, $0^{th}$ bitline memory cell 32 and up to and including a first memory bank, $Y^{th}$ wordline, $0^{th}$ bitline memory cell 34. The first memory bank 20 further includes up to and including a first memory bank, $0^{th}$ wordline, $Q^{th}$ bitline memory cell 36 and up to and including a first memory bank, $Y^{th}$ wordline, $Q^{th}$ bitline memory cell 38. Additionally, the first memory bank 20 includes multiple write buffers 40, multiple read buffers 42, a $0^{th}$ write bitline 44 and $0^{th}$ read bitline 46, and up to and including a $Q^{th}$ write bitline 48 and $Q^{th}$ read bitline 50. The first memory bank, $0^{th}$ wordline $WL_{OB1}$ is coupled to each of the first memory bank, $0^{th}$ wordline, $0^{th}$ bitline memory cell 32 and up to and including the first memory bank, $0^{th}$ wordline, $Q^{th}$ bitline memory cell 36. Similarly, the first memory bank, $Y^{th}$ wordline $WL_{YB1}$ is coupled to each of first memory bank, $Y^{th}$ wordline, $0^{th}$ bitline memory cell 34 and up to and including the first memory bank, $Y^{th}$ wordline, $Q^{th}$ bitline memory cell 38. The $0^{th}$ write bitline 44 and $0^{th}$ read bitline 46 are coupled to each of the first memory bank, $0^{th}$ wordline, $0^{th}$ bitline memory cell 32 and up to and including the first memory bank, $Y^{th}$ wordline, $0^{th}$ bitline memory cell 34, to an output of the write buffer 40, and to an input of the read buffer 42. Similarly, the $Q^{th}$ write bitline 48 and $Q^{th}$ read bitline 50 are coupled to each of the first memory bank, $0^{th}$ wordline, $Q^{th}$ bitline memory cell 36 and up to and including the first memory bank, $Y^{th}$ wordline, $Q^{th}$ bitline memory cell 38, to an output of the write buffer 40, and to an input of the read buffer 42.

The $0^{th}$ data signal $DATA_0$ and up to and including the $Q^{th}$ data signal $DATA_Q$ correlate respectively to the $0^{th}$ write bitline 44 and $0^{th}$ read bitline 46, and up to and including the $Q^{th}$ write bitline 48 and $Q^{th}$ read bitline 50. An input of each write buffer 40 receives a corresponding one of the $0^{th}$ data signal $DATA_0$ and up to and including the $Q^{th}$ data signal $DATA_Q$. Similarly, an input of each read buffer 42 may be capable of providing a corresponding one of the $0^{th}$ data signal $DATA_0$ and up to and including the $Q^{th}$ data signal $DATA_Q$. An output enable input of each write buffer 40 receives the first memory bank, write bitline access signal $BL_{WRB1}$ and an output enable input of each read buffer 42 receives the first memory bank, read bitline access signal $BL_{RDB1}$.

During each memory access, all wordlines associated with unselected memory banks may remain in an inactive state, and only one wordline associated with a selected memory bank transitions to an active state. Therefore, wordlines exhibit "one hot" behavior to avoid contention between multiple rows of memory cells. When a wordline transitions to an active state, a memory storage element in each memory cell in that row may be coupled to its corresponding write bitline, read bitline, or both. Then, when either of the bitline access signals transitions to an active state, data may be read into or read from the memory cells in the active row. This bitline access signal may control amplifiers to increase or "sense" the state of the bitline differential or signal levels.

For example, during a memory access to the first memory bank 20, the first memory bank, $0^{th}$ wordline $WL_{0B1}$ transitions to an active state. As a result the memory storage elements in the first memory bank, $0^{th}$ wordline, $0^{th}$ bitline memory cell 32 and up to and including the first memory bank, $0^{th}$ wordline, $Q^{th}$ bitline memory cell 36 are coupled to the $0^{th}$ write bitline 44 and $0^{th}$ read bitline 46, and up to and including the $Q^{th}$ write bitline 48 and $Q^{th}$ read bitline 50, respectively. Then, if the memory access is a memory write, when the first memory bank, write bitline access signal $BL_{WRB1}$ transitions to an active state, write data provided by the $0^{th}$ data signal $DATA_0$ and up to and including the $Q^{th}$ data signal $DATA_Q$ is written into the first memory bank, $0^{th}$ wordline, $0^{th}$ bitline memory cell 32 and up to and including the first memory bank, $0^{th}$ wordline, $Q^{th}$ bitline memory cell 36, respectively. If the memory access is a data read, when the first memory bank, read bitline access signal $BL_{RDB1}$ transitions to an active state, read data provided by the first memory bank, $0^{th}$ wordline, $0^{th}$ bitline memory cell 32 and up to and including the first memory bank, $0^{th}$ wordline, $Q^{th}$ bitline memory cell 36 are provided to the $0^{th}$ data signal $DATA_0$ and up to and including the $Q^{th}$ data signal $DATA_Q$ to the memory control circuitry 12 (FIG. 1).

In an exemplary embodiment of the first memory bank 20, the first memory bank memory cells 32, 34, 36, 38 may be six transistor memory cells, may be SRAM memory cells, or both. The first memory bank 20 illustrated in FIG. 6 is an exemplary embodiment of the present disclosure and not intended to limit the scope of the present disclosure. Alternate embodiments of the first memory bank 20 may omit any or all of the signals shown in FIG. 6, may add other signals, may omit any or all of the circuitry shown in FIG. 6, may add other circuitry, or any combination thereof.

Figure 7:
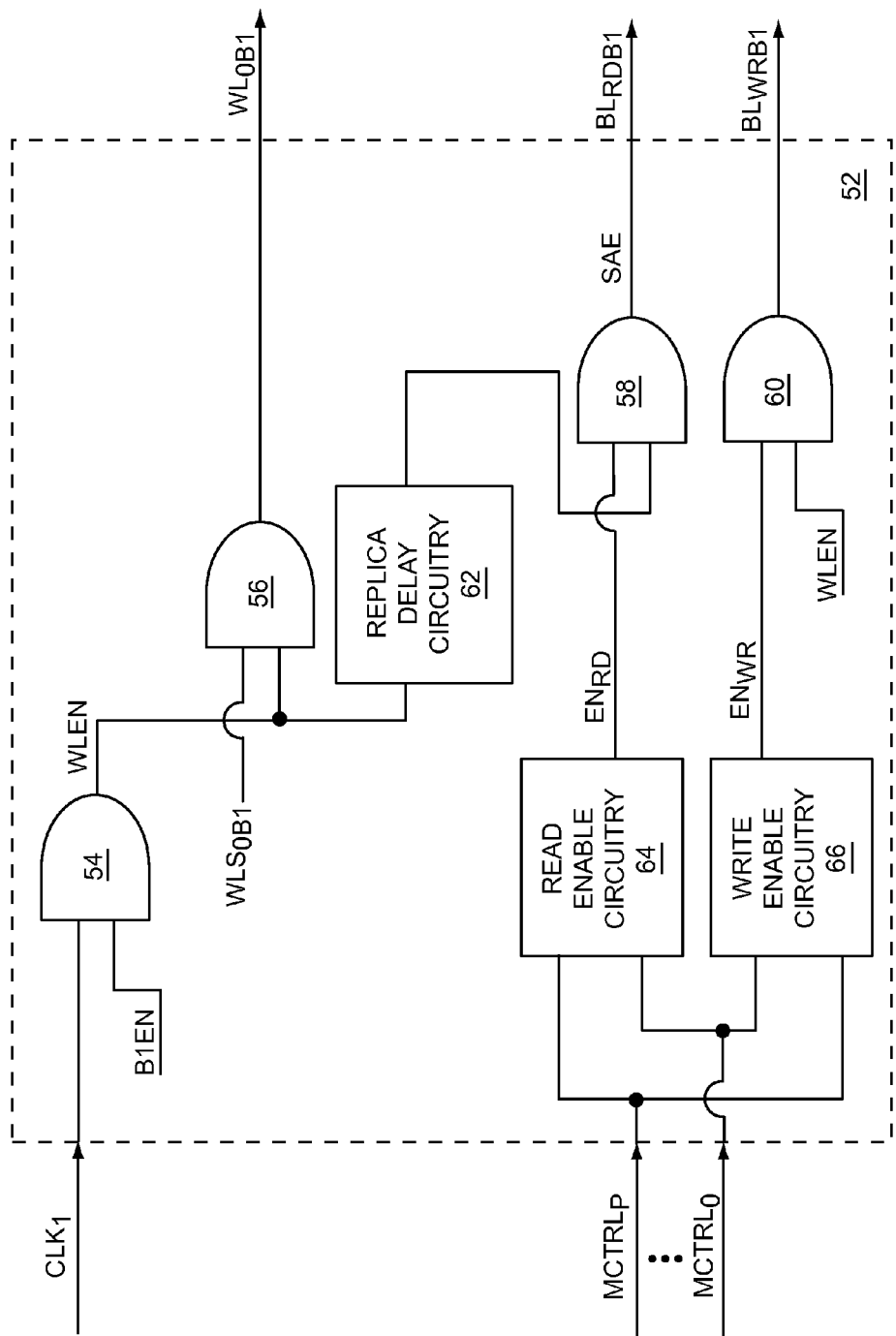
FIG. 7 shows partial conventional decode circuitry of conventional decode circuitry illustrated in FIG. 3 according to the prior art.

FIG. 7 shows partial conventional decode circuitry 52 of the conventional decode circuitry 18 illustrated in FIG. 3 according to the prior art. The partial conventional decode circuitry 52 includes circuitry to provide the first memory bank, $0^{th}$ wordline $WL_{0B1}$, the first memory bank, read bitline access signal $BL_{RDB1}$, and the first memory bank, write bitline access signal $BL_{WRB1}$. The partial conventional decode circuitry 52 includes a first AND gate 54, a second AND gate 56, a third AND gate 58, a fourth AND gate 60, replica delay circuitry 62, read enable circuitry 64, and write enable circuitry 66. The first AND gate 54 receives the first clock signal $CLK_1$ from the memory control circuitry 12 (FIG. 1) and a first bank enable signal B1EN, and provides a wordline enable signal WLEN based on logically ANDing the first clock signal $CLK_1$ and the first bank enable signal B1EN. The first bank enable signal B1EN is provided by the conventional decode circuitry 18 (FIG. 3). The second AND gate 56 receives the wordline enable signal WLEN and a first memory bank, $0^{th}$ wordline enable signal $WLS_{0B1}$, and provides the first memory bank, $0^{th}$ wordline $WL_{0B1}$ based on logically ANDing the wordline enable signal WLEN and the first memory bank, $0^{th}$ wordline enable signal $WLS_{0B1}$. The first memory bank, $0^{th}$ wordline enable signal $WLS_{0B1}$, is provided by the conventional decode circuitry 18 (FIG. 3). The replica delay circuitry 62 receives the gated wordline enable signal WLEN and provides a signal based on delaying the wordline enable signal WLEN.

Both the read enable circuitry 64 and the write enable circuitry 66 receive the $0^{th}$ memory control signal $MCTRL_0$ and up to and including the $P^{th}$ memory control signal $MCTRL_P$ from the memory control circuitry 12 (FIG. 1). The read enable circuitry 64 provides a read enable signal $EN_{RD}$ based on the $0^{th}$ memory control signal $MCTRL_0$ and up to and including the $P^{TH}$ memory control signal $MCTRL_P$. The write enable circuitry 66 provides a write enable signal $EN_{WR}$ based on the $0^{th}$ memory control signal $MCTRL_0$ and up to and including the $P^{TH}$ memory control signal $MCTRL_P$. The third AND gates 58 receives an output signal from the replica delay circuitry 62 and the read enable signal $EN_{RD}$, and provides a sense amp enable (SAE) signal based on logically ANDing the read enable signal $EN_{RD}$ and the output signal from the replica delay circuitry 62. The SAE signal provides the first memory bank, read bitline access signal $BL_{RDB1}$. The fourth AND gate 60 receives the wordline enable signal WLEN and the write enable signal $EN_{WR}$, and provides the first memory bank, write bitline access signal $BL_{WRB1}$ based on logically ANDing the write enable signal $EN_{WR}$ and the wordline enable signal WLEN. Alternatively, the replica delay circuitry 62 may be coupled in series with the output of the third AND gate 58 instead of being coupled to an input of the third AND gate 58.

FIGS. 8A through 8E are graphs illustrating timing relationships between signals associated with the partial conventional decode circuitry 52 and the conventional decode circuitry 18 illustrated in FIG. 7 and FIG. 3, respectively, during a memory access to a memory location associated with the first memory bank, $0^{th}$ wordline $WL_{0B1}$. FIG. 8A illustrates the first clock signal $CLK_1$ provided by the memory control circuitry 12 (FIG. 1). FIG. 8B illustrates the $0^{th}$ address signal $ADDR_0$ and up to and including the $M^{th}$ address signal $ADDR_M$ provided by the memory control circuitry 12 (FIG. 1). FIG. 8C illustrates the wordline enable signal WLEN provided by the first AND gate 54 (FIG. 7). FIG. 8D illustrates a signal provided by the first memory bank, $0^{th}$ wordline $WL_{0B1}$ (FIG. 7). FIG. 8E illustrates the sense amp enable signal SAE provided by the replica delay circuitry 62 (FIG. 7). Referring to FIG. 8A, during each memory access, the first clock signal $CLK_1$ includes a first phase 68, a second phase 70 following the first phase 68, a first transition 72 at the end of the first phase 68 and at the beginning of the second phase 70, and a second transition 74 at the end of the second phase 70. Referring to FIG. 8B, during the first phase 68 and the second phase 70 of each memory access, the $0^{th}$ address signal $ADDR_0$ and up to and including the $M^{th}$ address signal $ADDR_M$ provide the memory address of the memory location to be accessed to the conventional decode circuitry 18, which starts decoding the address to select a wordline. The memory address may be latched into the conventional decode circuitry 18 at the first transition 72.

Referring to FIG. 8C, since in the presented example the memory access is to a memory location in the first memory bank 20, if the conventional decode circuitry 18 (FIG. 3) has decoded which memory bank is selected by the time of the first transition 72, the first bank enable signal B1EN (FIG. 7) will transition from an inactive state into an active state by the time of the first transition 72, and the wordline enable signal WLEN will transition from an inactive state to an active state in response to the first transition 72. Referring to FIG. 8D, the signal associated with the first memory bank, $0^{th}$ wordline $WL_{OB1}$ transitions from an inactive state to an active state when both the wordline enable signal WLEN transitions to its active state and the first memory bank, $0^{th}$ wordline enable signal $WLS_{OB1}$ (FIG. 7) transitions from an inactive state to an active state. However, due to the size and complexity of the conventional decode circuitry 18 (FIG. 3), due to large capacitive loads associated with the first clock signal $CLK_1$ as a result of many copies of circuits in the conventional decode circuitry 18 (FIG. 3), or both, decode delays may be significant. As a result, a wordline enable to wordline decode delay 76 may occur as a result of an address stable to wordline decode delay 78 that pushes the transition of the signal associated with the first memory bank, $0^{th}$ wordline $WL_{OB1}$ to its active state well beyond the first transition 72. Referring to FIG. 8E, to avoid enabling the read access (avoid sensing the bitline states) before the transition of the signal associated with the first memory bank, $0^{th}$ wordline $WL_{OB1}$ to its active state followed by the full signal development of the bitlines, which may be problematic, a replica delay 80 provided by the replica delay circuitry 62 (FIG. 7) pushes the transition of the sense amp enable signal SAE from its inactive state to its active state beyond the transition of the signal associated with the first memory bank, $0^{th}$ wordline $WL_{OB1}$ to its active state plus the time for the bitlines to achieve a signal level that can be reliably sensed. However, maximizing memory performance means minimizing memory access times, which requires minimizing the replica delay 80. By minimizing the replica delay 80, a critical timing race condition is created between the replica delay 80 and the wordline enable to wordline decode delay 76. Since the replica delay 80 is based on the replica delay circuitry 62 (FIG. 7) and since the wordline enable to wordline decode delay 76 is based on decoding circuitry, variations in process, voltage, temperature, or any combination thereof may significantly minimize or eliminate operating margins. If the critical timing race is "lost", i.e., the bitlines have insufficient signal difference for correct sensing when the SAE signal is asserted to activate the sensing, the read from the memory bank may be incorrect.

Figure 9A:
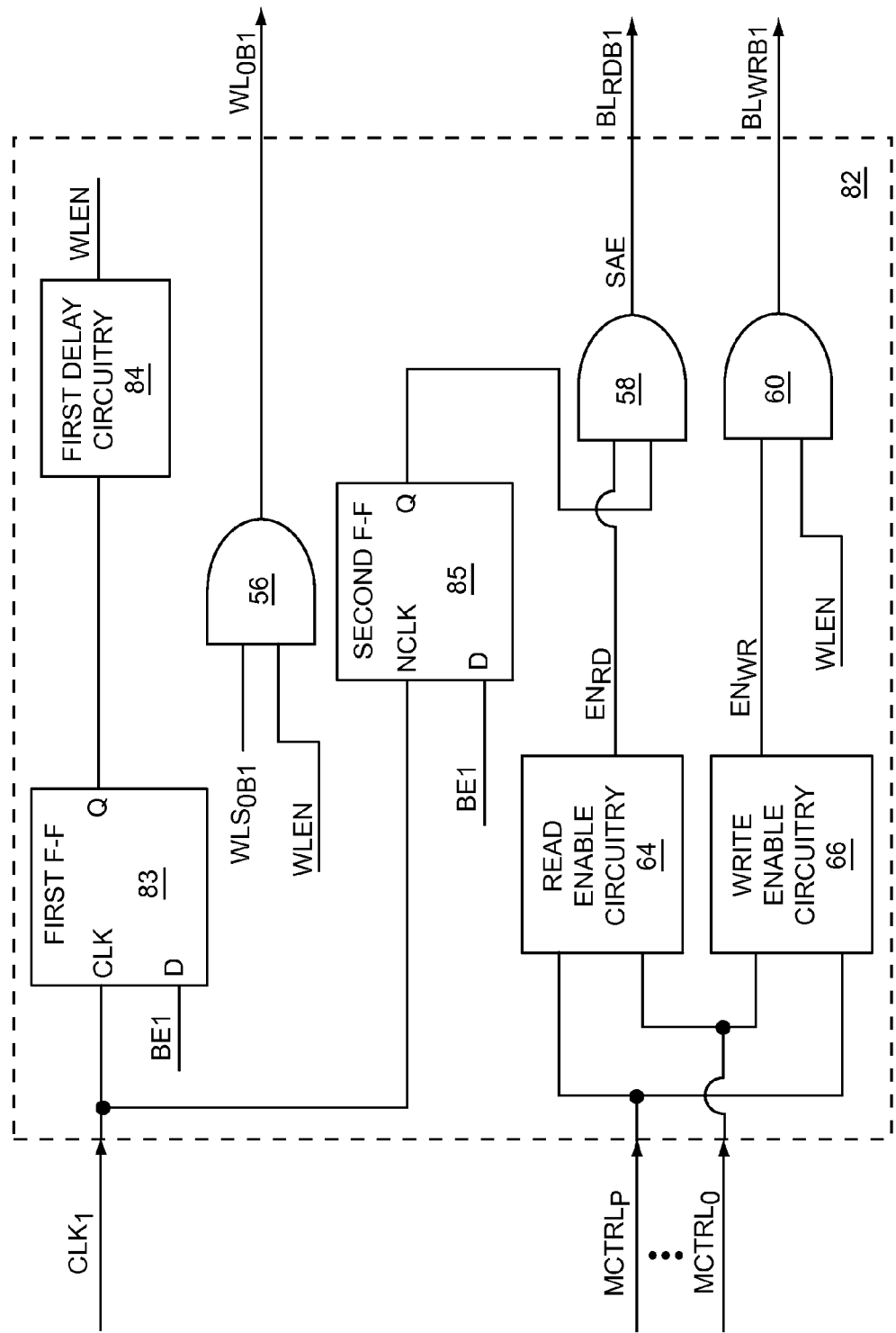
FIG. 9A shows a partial decode circuit of a first memory bank decode circuit illustrated in FIG. 5 according to one embodiment of the first memory bank decode circuit.

FIG. 9A shows a partial decode circuit 82 of the first memory bank decode circuit 28 illustrated in FIG. 5 according to one embodiment of the first memory bank decode circuit 28. The partial decode circuit 82 includes circuitry to provide the first memory bank, $0^{th}$ wordline $WL_{OB1}$, the first memory bank, read bitline access signal $BL_{RDB1}$, and the first memory bank, write bitline access signal $BL_{WRB1}$. The partial decode circuit 82 includes a first flip-flop 83, first delay circuitry 84, a second flip-flop 85, the second AND gate 56, the third AND gate 58, the fourth AND gate 60, the read enable circuitry 64, and the write enable circuitry 66. The first flip-flop 83 receives the first clock signal $CLK_1$ into a clock input CLK from the memory control circuitry 12 (FIG. 1) and a first bank enable signal BE1 into a data input D, and feeds the first delay circuitry 84 from a data output Q to provide the wordline enable signal WLEN based on the first transition 72 (FIG. 10A) of the first clock signal $CLK_1$ and the first bank enable signal BE1. The first bank enable signal BE1 is provided by the first memory bank decode circuit 28 (FIG. 5).

The second AND gate 56 receives the wordline enable signal WLEN and the first memory bank, $0^{th}$ wordline enable signal $WLS_{OB1}$, and provides the first memory bank, $0^{th}$ wordline $WL_{OB1}$ based on logically ANDing the wordline enable signal WLEN and the first memory bank, $0^{th}$ wordline enable signal $WLS_{OB1}$. The first memory bank, $0^{th}$ wordline enable signal $WLS_{OB1}$, is provided by the first memory bank decode circuit 28 (FIG. 5). The second flip-flop 85 receives the first clock signal $CLK_1$ into an inverting clock input NCLK and the first bank enable signal BE1 into a data input D, and feeds one input of the third AND gate 58 from a data output Q. The sense amp enable signal SAE is based on the second transition 74 of the first clock signal $CLK_1$ and the first bank enable signal BE1.

Both the read enable circuitry 64 and the write enable circuitry 66 receive the $0^{th}$ memory control signal $MCTRL_0$ and up to and including the $P^{th}$ memory control signal $MCTRL_P$ from the memory control circuitry 12 (FIG. 1). The read enable circuitry 64 provides the read enable signal $EN_{RD}$ based on the $0^{th}$ memory control signal $MCTRL_0$ and up to and including the $P^{TH}$ memory control signal $MCTRL_P$. The write enable circuitry 66 provides the write enable signal $EN_{WR}$ based on the $0^{th}$ memory control signal $MCTRL_0$ and up to and including the $P^{th}$ memory control signal $MCTRL_P$. The third AND gate 58 receives the signal from the data output Q of the second flip-flop 85 and the read enable signal $EN_{RD}$, and provides the first memory bank, read bitline access signal $BL_{RDB1}$ based on logically ANDing the read enable signal $EN_{RD}$ and the signal from the data output Q of the second flip-flop 85. The first memory bank, read bitline access signal $BL_{RDB1}$ provides the sense amp enable signal SAE. By gating the sense amp enable signal SAE from the second transition 74 (FIG. 10A), there is enough time between the wordline enable signal WLEN and the sense amp enable signal SAE for the bitlines to develop sufficient signal for reliable sensing. The fourth AND gate 60 receives the write enable signal $EN_{WR}$ and the wordline enable signal WLEN, and provides the first memory bank, write bitline access signal $BL_{WRB1}$ based on logically ANDing the write enable signal $EN_{WR}$ and the wordline enable signal WLEN. The partial decode circuit 82 illustrated in FIG. 9A is an exemplary embodiment of the present disclosure and not intended to limit the scope of the present disclosure. Alternate embodiments of the partial decode circuit 82 may omit any or all of the signals shown in FIG. 9A, may add other signals, may omit any or all of the circuitry shown in FIG. 9A, may add other circuitry, or any combination thereof.

Figure 9B:
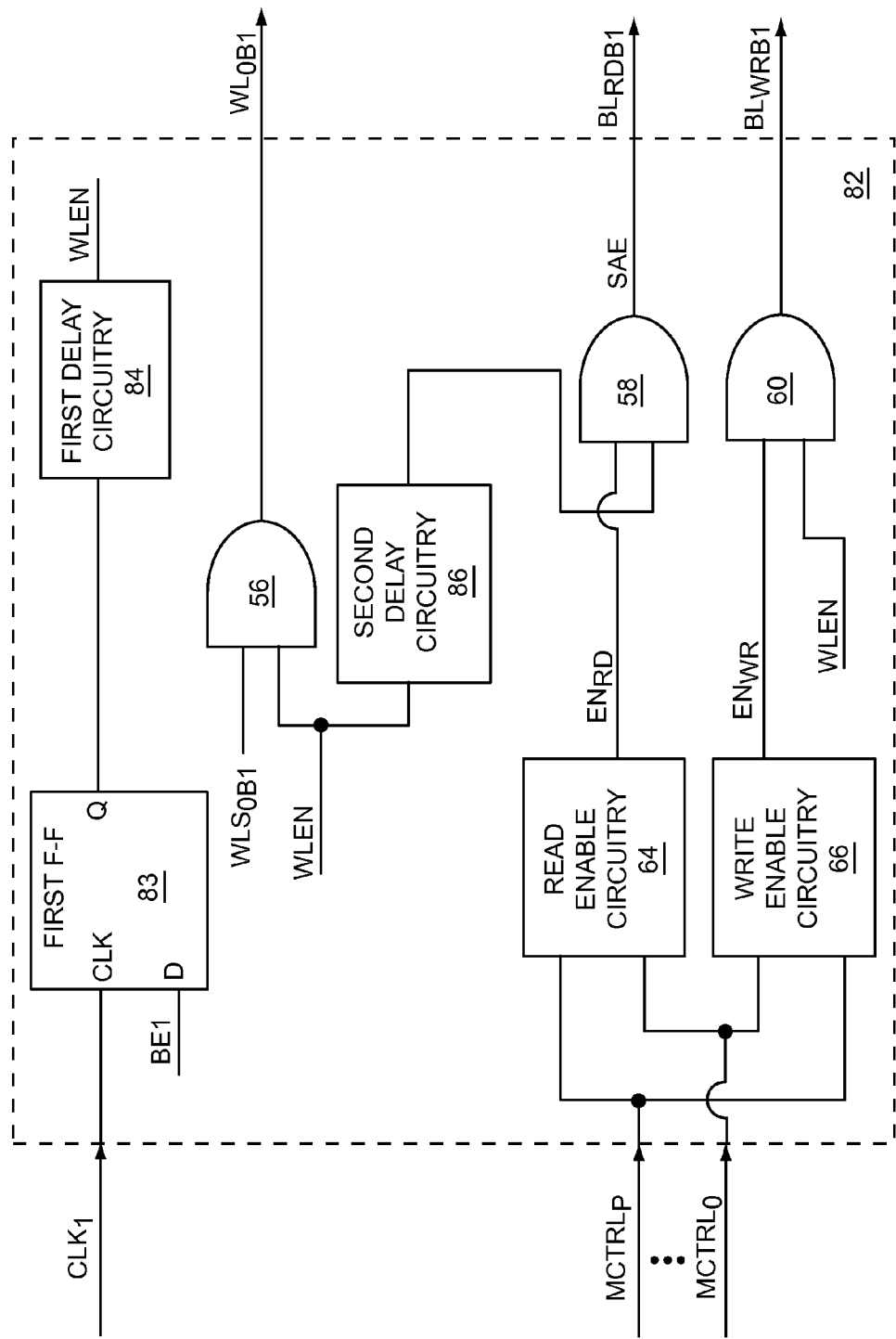
FIG. 9B shows a partial decode circuit of a first memory bank decode circuit illustrated in FIG. 5 according to an alternate embodiment of the first memory bank decode circuit.

FIG. 9B shows the partial decode circuit 82 of the first memory bank decode circuit 28 illustrated in FIG. 5 according to an alternate embodiment of the first memory bank decode circuit 28. The partial decode circuit 82 illustrated in FIG. 9B is similar to the partial decode circuit 82 illustrated in FIG. 9A, except the second flip-flop 85 is replaced with second delay circuitry 86, which receives the wordline enable signal WLEN and feeds the third AND gate 58 based on further delaying the wordline enable signal WLEN. By further delaying the wordline enable signal WLEN, there is enough time between the wordline enable signal WLEN and the sense amp enable signal SAE for the bitlines to develop sufficient signal for reliable sensing.

FIGS. 10A through 10F are graphs illustrating timing relationships between signals associated with the partial decode circuit 82 and the first memory bank decode circuit 28 illustrated in FIG. 9A and FIG. 5, respectively, during a memory access to a memory location associated with the first memory bank, $0^{th}$ wordline $WL_{OB1}$. FIG. 10A illustrates the first clock signal $CLK_1$ provided by the memory control circuitry 12

(FIG. 1). FIG. 10B illustrates the $0^{th}$ address signal $ADDR_0$ and up to and including the $M^{th}$ address signal $ADDR_M$ provided by the memory control circuitry 12 (FIG. 1). FIG. 10 C illustrates the first memory bank, $0^{th}$ gated address signal $GADR_{OB1}$ and up to and including the first memory bank, $M^{th}$ gated address signal $GADR_{OB1}$ provided by the bank selection and address gating circuitry 24 (FIG. 4). FIG. 10D illustrates the first memory bank, $0^{th}$ wordline enable signal $WLS_{OB1}$ provided by the first delay circuitry 84 (FIG. 9A). FIG. 10E illustrates the wordline enable signal WLEN (FIG. 9A). FIG. 10F illustrates the sense amp enable signal SAE provided by the third AND gate 58 (FIG. 9A). Referring to FIG. 10A, during each memory access, the first clock signal $CLK_1$ includes the first phase 68, the second phase 70 following the first phase 68, the first transition 72 at the end of the first phase 68 and at the beginning of the second phase 70, and the second transition 74 at the end of the second phase 70. Referring to FIG. 10B, during the first phase 68 and the second phase 70 of each memory access, the $0^{th}$ address signal $ADDR_0$ and up to and including the $M^{th}$ address signal $ADDR_M$ provide the memory address of the memory location to be accessed to the bank selection and address gating circuitry 24 (FIG. 4). The memory address may be clocked into the bank selection and address gating circuitry 24 at the first transition 72. Specifically, the first transition 72 may clock in a status of the address signals $ADDR_0$, $ADDR_M$ into the bank selection and address gating circuitry 24 (FIG. 4) to provide the memory address.

Referring to FIG. 10C, the bank selection and address gating circuitry 24 (FIG. 4) provides the first memory bank, $0^{th}$ gated address signal $GADR_{OB1}$ and up to and including the first memory bank, $M^{th}$ gated address signal $GADR_{MB1}$ to the first memory bank decode circuit 28 (FIG. 5) based on the $0^{th}$ address signal $ADDR_0$ and up to and including the $M^{th}$ address signal $ADDR_M$ at the time of the first transition 72. As a result, the first memory bank decode circuit 28 (FIG. 5) doesn't begin decoding the memory address of the memory location to be accessed until the first transition 72.

Referring to FIG. 10D, the bank selection and address gating circuitry 24 (FIG. 4) has decoded which bank is selected by the time of the first transition 72. The bank selection and address gating circuitry 24 decodes the selected memory address based on the first memory bank gated address signals $GADR_{OB1}$, $GADR_{MB1}$, such that after a decode delay 87, the first memory bank, $0^{th}$ wordline enable signal $WLS_{OB1}$ transitions from an inactive state to an active state, since in the presented example the memory access is to a memory location in the first memory bank 20. Further, by the time of the first transition 72, the first bank enable signal BE1 will have transitioned from an inactive state to an active state. Therefore, the data output Q of the first flip-flop 83 will transition from an inactive state to an active state based on the first transition 72. After a wordline delay 88 introduced by the first delay circuitry 84, the wordline enable signal WLEN will transition from an inactive state to an active state in response to the first transition 72, as illustrated in FIG. 10E. As long as the wordline delay 88 is longer than the decode delay 87, only one wordline will be selected for each memory access. The signal associated with the first memory bank, $0^{th}$ wordline $WL_{OB1}$ transitions from an inactive state to an active state when both the wordline enable signal WLEN transitions to its active state and the first memory bank, $0^{th}$ wordline enable signal $WLS_{OB1}$ (FIG. 9A) transitions from an inactive state to an active state.

Referring to FIG. 10F, to avoid enabling bitline access before the transition of the signal associated with the first memory bank, $0^{th}$ wordline $WL_{OB1}$ to its active state, which may be problematic, transitioning of the sense amp enable signal SAE from its inactive state to its active state is based on the second transition 74. By enabling the transitions of the sense amp enable signal SAE and the signal associated with the first memory bank, $0^{th}$ wordline $WL_{OB1}$ to their respective active states from two separate clock edges, the critical timing race condition created between the replica delay 80 and the wordline enable to wordline decode delay 76 illustrated in FIG. 8E and FIG. 8D, respectively, is avoided. If the wordline delay 88 encroaches upon the second transition 74, the period of the first clock signal $CLK_1$ may be lengthened to increase timing margins.

Figure 11:
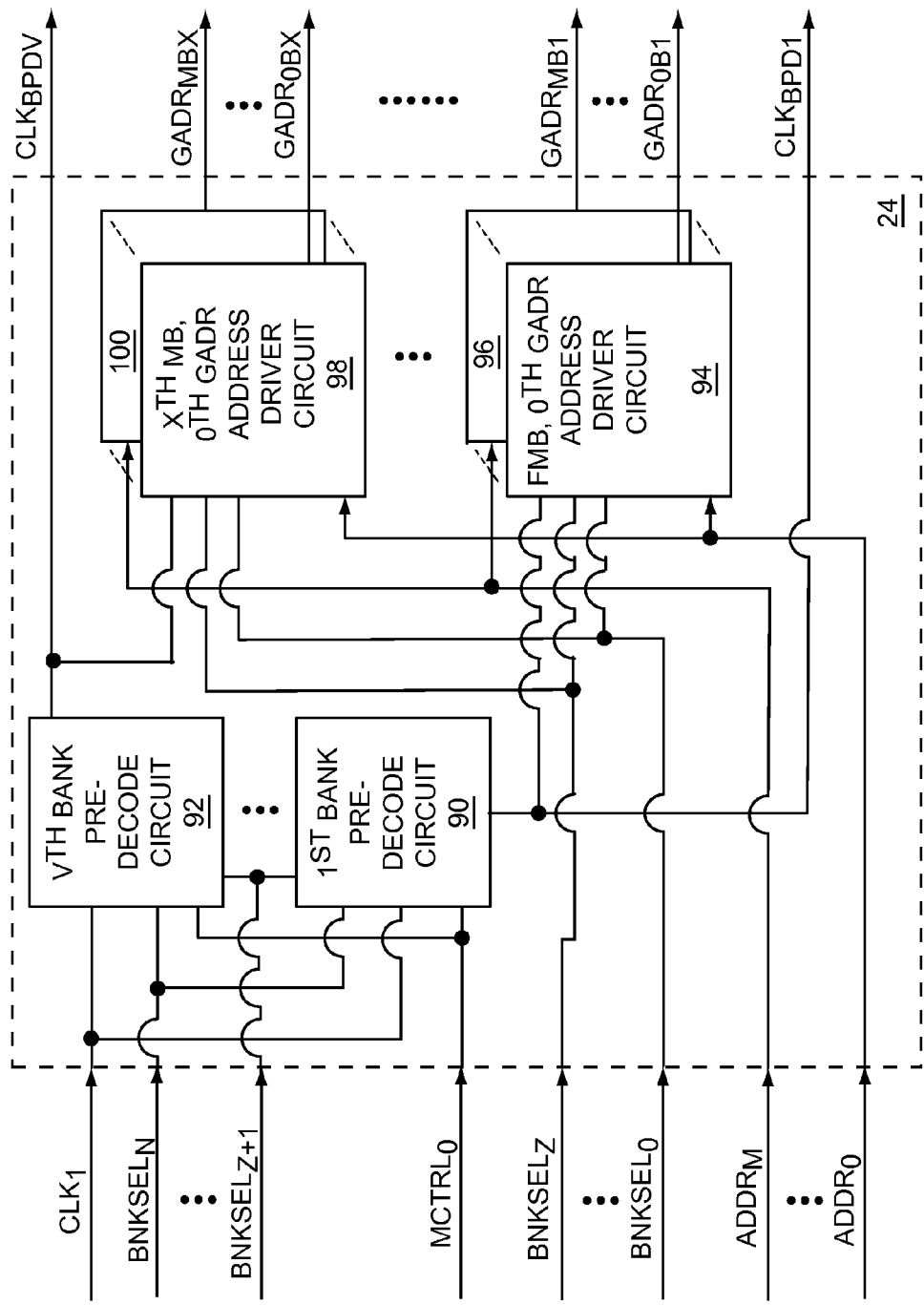
FIG. 11 shows details of bank selection and address gating circuitry illustrated in FIG. 4 according to one embodiment of the bank selection and address gating circuitry.

FIG. 11 shows details of the bank selection and address gating circuitry 24 illustrated in FIG. 4 according to one embodiment of the bank selection and address gating circuitry 24. The bank selection and address gating circuitry 24 includes a first bank pre-decode circuit 90 and up to and including a $V^{th}$ bank pre-decode circuit 92. Further, the bank selection and address gating circuitry 24 includes a first memory bank, $0^{th}$ gated address driver circuit 94 and up to and including a first memory bank, $M^{th}$ gated address driver circuit 96. Additionally, the bank selection and address gating circuitry 24 includes up to and including an $X^{th}$ memory bank, $0^{th}$ gated address driver circuit 98 and up to and including an $X^{th}$ memory bank, $M^{th}$ gated address driver circuit 100.

Each of the first bank pre-decode circuit 90 and up to and including the $V^{th}$ bank pre-decode circuit 92 receive the first clock signal $CLK_1$, the $0^{th}$ memory control signal $MCTRL_0$, and a Z+1 bank select signal $BNKSEL_{z+1}$ and up to and including the $N^{th}$ bank select signal $BNKSEL_N$. Further, each of the bank pre-decode circuits 90, 92 receive the $0^{th}$ memory control signal $MCTRL_0$, which may be used to signal a beginning of a memory access. In alternate embodiments of the bank selection and address gating circuitry 24, any or all of the memory control signals $MCTRL_0$, $MCTRL_P$ may be used to signal the beginning of the memory access.

The first bank pre-decode circuit 90 and up to and including the $V^{th}$ bank pre-decode circuit 92 provide a respective first bank pre-decode clock signal $CLK_{BPD1}$ and up to and including a $V^{th}$ bank pre-decode clock signal $CLK_{BPDV}$. Each of the bank pre-decode clock signals $CLK_{BPD1}$, $CLK_{BPDV}$ are provided to a respective group of the gated address driver circuits 94, 96, 98, 100. Additionally, the bank pre-decode clock signals $CLK_{BPD1}$, $CLK_{BPDV}$ may be provided to the solid state memory circuitry 26 (FIG. 4) instead of the memory bank clock signals $CLK_{B1}$, $M_{BX}$ (FIG. 4).

Each of the gated address driver circuits 94, 96, 98, 100 receives a corresponding one of the address signals $ADDR_0$, $ADDR_M$. For example, the first memory bank, $0^{th}$ gated address driver circuit 94, the $X^{th}$ memory bank, $0^{th}$ gated address driver circuit 98, and all $0^{th}$ gated address driver circuits in between (not shown) receive the $0^{th}$ address signal $ADDR_0$ and so on up until the first memory bank, $M^{th}$ gated address driver circuit 96, the $X^{th}$ memory bank, $M^{th}$ gated address driver circuit 100, and all $M^{th}$ gated address driver circuits in between (not shown) receive the $M^{th}$ address signal $ADDR_M$. Further, each of the gated address driver circuits 94, 96, 98, 100 receives the $0^{th}$ bank select signal $BNKSEL_0$ and up to and including a $Z^{th}$ bank select signal $BNKSEL_z$.

Each of the first memory bank gated address driver circuits 94, 96 provides a corresponding one of the first memory bank gated address signals $GADRD_{OB1}$, $GADR_{MB1}$. Similarly, each of the $X^{th}$ memory bank gated address driver circuits 96, 100 provides a corresponding one of the $X^{th}$ memory bank gated address signals $GADR_{OBX}$, $GADR_{MBX}$, and each gated address driver circuit (not shown) in between the first memory bank and the $X^{th}$ memory bank and the first gated address and the $M^{th}$ gated address provides a corresponding gated address signal (not shown). For example, if the total number of address lines is 16, such that M=15, and the total number of memory banks is 16, such that Z=1, Z+1=2, and N=3, then the total number of gated address signals is 16 times 16, which is 256. Therefore, 256 gated address driver circuits 94, 96, 98, 100 would be needed to provide the 256 gated address signals $GADR_{OB1}$, $GADR_{MB1}$, $GADR_{OBX}$, $GADR_{MBX}$. Also, the number of bank pre-decode circuits 90, 92 is four and the number of bank pre-decode clock signals $CLK_{BPD1}$, $CLK_{BPDV}$ is four. Therefore, the 256 gated address driver circuits 94, 96, 98, 100 would be divided into four groups of 64 gated address driver circuits with the each gated address driver circuit in a group receiving one of the four bank pre-decode clock signals $CLK_{BPD1}$, $CLK_{BPDV}$.

During each memory access, a memory bank is selected during the first phase 68 of the first clock signal $CLK_1$ (FIG. 10A). Therefore, only one of the bank pre-decode circuits 90, 92 is associated with the selected memory bank. The one of the bank pre-decode clock signals $CLK_{BPD1}$, $CLK_{BPDV}$ associated with the selected memory bank is based on the first clock signal $CLK_1$. However, all others of the bank pre-decode clock signals $CLK_{BPD1}$, $CLK_{BPDV}$ are prevented from transitioning, and gated address signals $GADR_{OB1}$, $GADR_{MB1}$, $GADR_{OBX}$, $GADR_{MBX}$ provided by the gated address driver circuits 94, 96, 98, 100 that receive non-transitioning bank pre-decode clock signals $CLK_{BPD1}$, $CLK_{BPDV}$ are prevented from transitioning. The group of the gated address driver circuits 94, 96, 98, 100 that receives a transitioning bank pre-decode clock signal includes a sub-group of the gated address driver circuits 94, 96, 98, 100 that are associated with the selected memory bank. The gated address signals provided by the sub-group of the gated address driver circuits 94, 96, 98, 100 are allowed to transition and are based on the address signals $ADDR_0$, $ADDR_M$. The gated address signals provided by the group of the gated address driver circuits 94, 96, 98, 100 that receives the transitioning bank pre-decode clock signal that are not associated with the selected memory bank are prevented from transitioning. The bank select signals $BNKSEL_0$, $BNKSEL_Z$ received by the gated address driver circuits 94, 96, 98, 100 de-select the group of the gated address driver circuits 94, 96, 98, 100 that receives the transitioning bank pre-decode clock signal that are not associated with the selected memory bank.

The bank selection and address gating circuitry 24 illustrated in FIG. 11 is an exemplary embodiment of the present disclosure and not intended to limit the scope of the present disclosure. In a first alternate embodiment of the bank selection and address gating circuitry 24, the bank pre-decode circuits 90, 92 are omitted, and the gated address driver circuits 94, 96, 98, 100 provide all memory bank decoding. In a second alternate embodiment of the bank selection and address gating circuitry 24, the bank pre-decode circuits 90, 92 receive all of the bank select signals $BNKSEL_0$, $BNKSEL_N$ and the gated address driver circuits 94, 96, 98, 100 don't receive any of the bank select signals $BNKSEL_0$, $BNKSEL_N$ and don't do any memory bank decoding. Additionally, the number of bank pre-decode clock signals $CLK_{BPD1}$, $CLK_{BPDV}$ is equal to the number of memory banks and, as a result, may provide the memory bank clock signals $CLK_{B1}$, $CLK_{BX}$ (FIG. 4). In a third alternate embodiment of the bank selection and address gating circuitry 24, the bank pre-decode circuits 90, 92 receive one of the bank select signals $BNKSEL_0$, $BNKSEL_N$ and the gated address driver circuits 94, 96, 98, 100 receive the remainder of the bank select signals $BNKSEL_0$, $BNKSEL_N$. In a fourth alternate embodiment of the bank selection and address gating circuitry 24, the gated address driver circuits 94, 96, 98, 100 receive one of the bank select signals $BNKSEL_0$, $BNKSEL_N$ and the bank pre-decode circuits 90, 92 receive the remainder of the bank select signals $BNKSEL_0$, $BNKSEL_N$. In a fifth alternate embodiment of the bank selection and address gating circuitry 24, there is only one bank select signal, the bank pre-decode circuits 90, 92 are omitted, and the gated address driver circuits 94, 96, 98, 100 provide all memory bank decoding. In a sixth alternate embodiment of the bank selection and address gating circuitry 24, there is only one bank select signal, one bank pre-decode circuit receives the bank select signal, and the gated address driver circuits 94, 96, 98, 100 don't receive the bank select signal. In another embodiment of the bank selection and address gating circuitry 24, each of the gated address driver circuits 94, 96, 98, 100 receives more than one of the address signals $ADDR_0$, $ADDR_M$ and provides corresponding gated address signals.

To provide maximum performance, the bank pre-decode circuits 90, 92, the gated address driver circuits 94, 96, 98, 100, and the memory bank decode circuits 28, 30 (FIG. 5) should be as fast as practical. Dynamic circuitry may be used to provide fast complementary metal oxide semiconductor (CMOS) circuits. Typically, P-type metal oxide semiconductor (PMOS) transistors are slower than N-type metal oxide semiconductor (NMOS) transistors due to the relatively high drive capability of the NMOS transistors. Dynamic circuits may operate in either a pre-charge mode or an evaluate mode. During the pre-charge mode, many PMOS transistors in a dynamic circuit are in an ON state and many NMOS transistors are in an OFF state, thereby giving the PMOS transistors ample time to "pre-charge" circuit nodes. When the pre-charge mode transitions to the evaluate mode, many of the PMOS transistors transition to an OFF state and many of the NMOS transistors transition to an ON state. Since the NMOS transistors are typically much faster than the PMOS transistors, switching times when transitioning from the pre-charge mode transitions to the evaluate mode are typically much shorter than switching times when transitioning from the evaluate mode to the pre-charge mode.

Cascading dynamic circuits creates dynamic domino circuits. During the pre-charge mode, PMOS transistors in all of the cascaded dynamic circuits pre-charge circuit nodes, then when the pre-charge mode transitions to the evaluate mode, as each cascaded dynamic circuit switches it can cause the next cascaded dynamic circuit to switch, and so on, like a set of dominos. The dynamic circuits may be single-ended or differential. In one embodiment of the present disclosure, the bank pre-decode circuits 90, 92, the gated address driver circuits 94, 96, 98, 100, the memory bank decode circuits 28, 30 (FIG. 5), or any combination thereof may include dynamic circuits. The bank pre-decode circuits 90, 92, the gated address driver circuits 94, 96, 98, 100, the memory bank decode circuits 28, 30 (FIG. 5), or any combination thereof may include single-ended dynamic circuits. The bank pre-decode circuits 90, 92, the gated address driver circuits 94, 96, 98, 100, the memory bank decode circuits 28, 30 (FIG. 5), or any combination thereof may include differential dynamic circuits. Dynamic circuits in any or all of the bank pre-decode circuits 90, 92, the gated address driver circuits 94, 96, 98, 100, and the memory bank decode circuits 28, 30 (FIG. 5), may be cascaded to form dynamic domino circuits. The dynamic domino circuits may include single-ended dynamic circuits, differential dynamic circuits, or any combination thereof. The dynamic circuits may operate in the pre-charge mode during the first phase 68 (FIG. 10A) and may operate in the evaluate mode during the second phase 70 (FIG. 10A).

Figure 12:
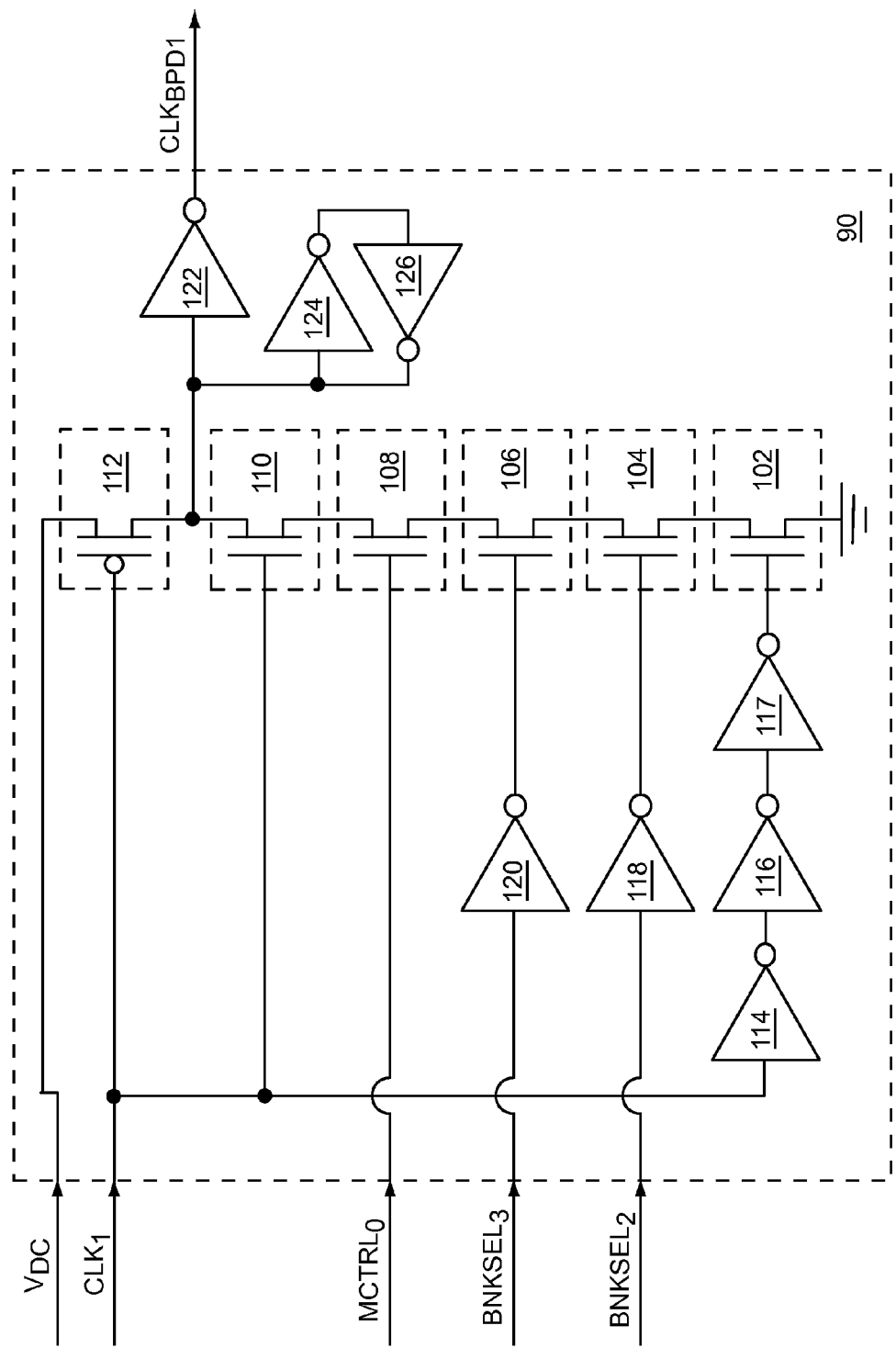
FIG. 12 shows details of a first bank pre-decode circuit illustrated in FIG. 11 according to one embodiment of the first bank pre-decode circuit.

FIG. 12 shows details of the first bank pre-decode circuit 90 illustrated in FIG. 11 according to one embodiment of the first bank pre-decode circuit 90. The first bank pre-decode circuit 90 illustrated in FIG. 11 is an example of a single-ended dynamic circuit. The first bank pre-decode circuit 90 receives a DC supply signal $V_{DC}$, the first clock signal $CLK_1$, the $0^{th}$ memory control signal $MCTRL_0$, a second bank select signal $BNKSEL_2$, and a third bank select signal $BNKSEL_3$, and provides the first bank pre-decode clock signal $CLK_{BPD1}$. The first bank pre-decode circuit 90 includes a first NMOS transistor element 102, a second NMOS transistor element 104, a third NMOS transistor element 106, a fourth NMOS transistor element 108, a fifth NMOS transistor element 110, a first PMOS transistor element 112, a first inverter 114, a second inverter 116, a third inverter 117, a fourth inverter 118, a fifth inverter 120, a sixth inverter 122, a seventh inverter 124, and a eighth inverter 126.

A gate of the first PMOS transistor element 112, a gate of the fifth NMOS transistor element 110, and an input to the first inverter 114 receive the first clock signal $CLK_1$. A gate of the fourth NMOS transistor element 108 receives the $0^{th}$ memory control signal $MCTRL_0$. An input to the fifth inverter 120 receives the third bank select signal $BNKSEL_3$. An output from the fifth inverter 120 is coupled to a gate of the third NMOS transistor element 106. An input to the fourth inverter 118 receives the second bank select signal $BNKSEL_2$. An output from the fourth inverter 118 is coupled to a gate of the second NMOS transistor element 104. An output from the first inverter 114 is coupled to an input to the second inverter 116. An output from the second inverter 116 is coupled to an input of the third inverter 117. An output from the third inverter 117 is coupled to a gate of the first NMOS transistor element 102. A source of the first NMOS transistor element 102 is coupled to ground. A drain of the first NMOS transistor element 102 is coupled to a source of the second NMOS transistor element 104. A drain of the second NMOS transistor element 104 is coupled to a source of the third NMOS transistor element 106. A drain of the third NMOS transistor element 106 is coupled to a source of the fourth NMOS transistor element 108. A drain of the fourth NMOS transistor element 108 is coupled to a source of the fifth NMOS transistor element 110. A drain of the fifth NMOS transistor element 110 is coupled to a drain of the first PMOS transistor element 112, to inputs of the sixth and the seventh inverters 122, 124, and to an output from the eighth inverter 126. A source of the first PMOS transistor element 112 receives the DC supply signal $V_{DC}$. An output from the sixth inverter 122 provides the first bank pre-decode clock signal $CLK_{BPD1}$. An output from the seventh inverter 124 is coupled to an input to the eighth inverter 126. The seventh inverter 124 and the eighth inverter 126 are cross-coupled to provide a keeper circuit, which may be optional. The drive strength of the eighth inverter 126 may be low to allow the keeper circuit to be easily over-driven.

During the first phase 68 of the first clock signal $CLK_1$, which selects the pre-charge mode for the first bank pre-decode circuit 90, the fifth NMOS transistor element 110 is in an OFF state, thereby isolating the second, the third, and the fourth NMOS transistor elements 104, 106, 108, and the first PMOS transistor element 112 is in an ON state, thereby driving the input to the sixth inverter 122 into a HIGH state, which causes the first bank pre-decode clock signal $CLK_{BPD1}$ to be driven to a LOW state. However, the first NMOS transistor element 102 is in an ON state. When the first clock signal $CLK_1$ transitions from the first phase 68 to the second phase 70, the first bank pre-decode circuit 90 transitions from the pre-charge mode to the evaluate mode. At the beginning of the evaluate mode, the first NMOS transistor element 102 and the fifth NMOS transistor element 110 are both in an ON state, thereby coupling the second, the third, and the fourth NMOS transistor elements 104, 106, 108 between ground and the input to the sixth inverter 122, and the first PMOS transistor element 112 is in an OFF state, which allows the input to the sixth inverter 122 to be driven to a LOW state. However, unless all of the second, the third, and the fourth NMOS transistor elements 104, 106, 108 are in an ON state, the input to the sixth inverter 122 remains in the HIGH state and the first bank pre-decode clock signal $CLK_{BPD1}$ remains in the LOW state. Once the transition from the first phase 68 to the second phase 70 ripples through the first, the second, and the third inverters 114, 116, 117, the first NMOS transistor element 102 transitions to an OFF state, thereby latching in the state that existed at the beginning of the evaluate phase. Any odd number of inverters beyond the first, the second, and the third inverters 114, 116, 117 will produce the latching effect. A larger number of inverters can allow more time for the dynamic gate to evaluate.

The first bank pre-decode circuit 90 is associated with a selected memory bank if both the second and the third bank select signals $BNKSEL_2$, $BNKSEL_3$ are in a LOW state and the $0^{th}$ memory control signal $MCTRL_0$ is in a HIGH state. If such conditions exist, the second, the third, and the fourth NMOS transistor elements 104, 106, 108 are in an ON state and during the evaluate mode, the sixth inverter 122 is driven to the LOW state, which causes the first bank pre-decode clock signal $CLK_{BPD1}$ to transition to a HIGH state, otherwise the first bank pre-decode clock signal $CLK_{BPD1}$ remains in the LOW state. The first bank pre-decode circuit 90 illustrated in FIG. 12 is an exemplary embodiment of the present disclosure and not intended to limit the scope of the present disclosure.

Figure 13:
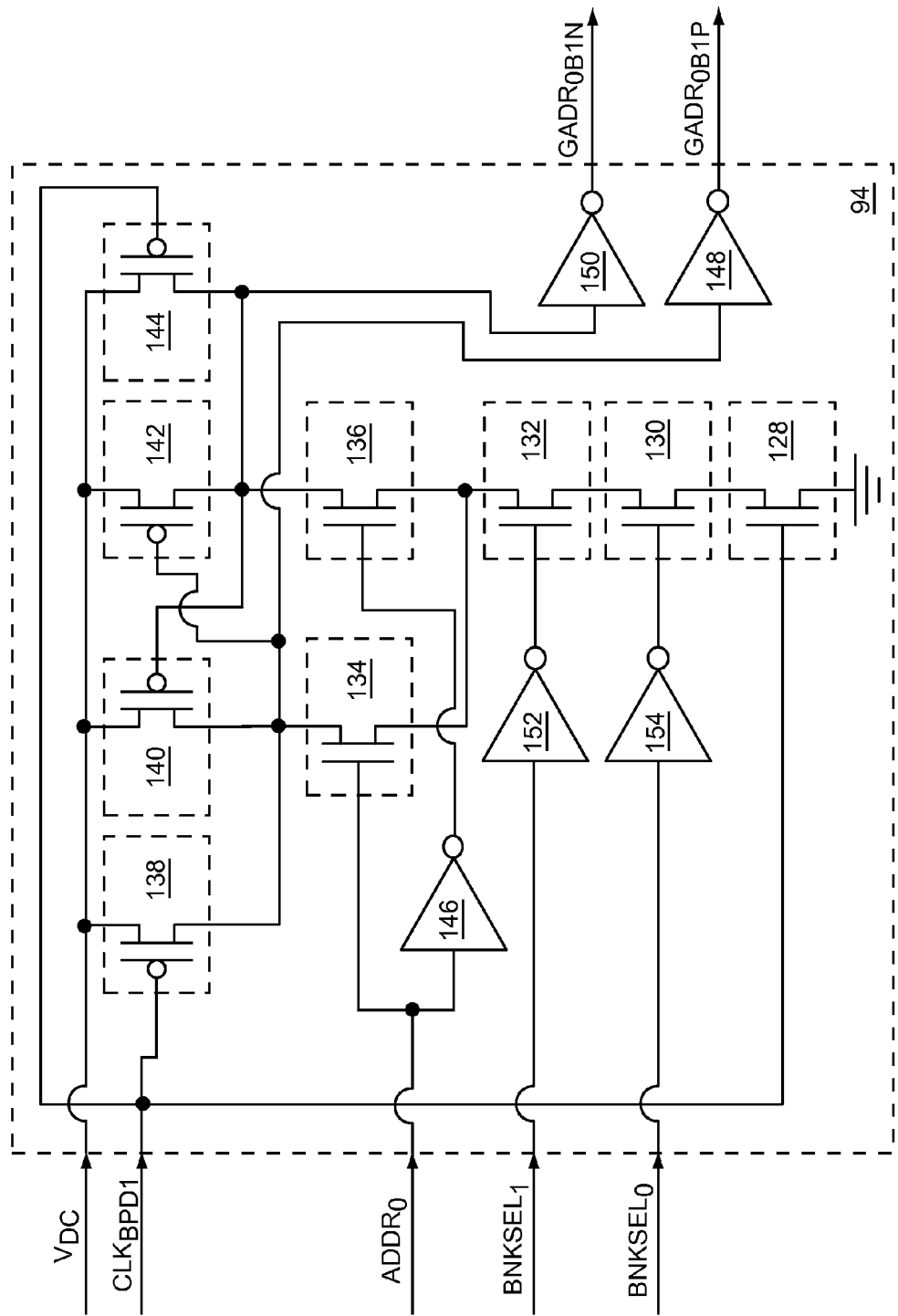
FIG. 13 shows details of a first memory bank, $0^{th}$ gated address driver circuit illustrated in FIG. 11 according to one embodiment of the first memory bank, $0^{th}$ gated address driver circuit.

FIG. 13 shows details of the first memory bank, $0^{th}$ gated address driver circuit 94 illustrated in FIG. 11 according to one embodiment of the first memory bank, $0^{th}$ gated address driver circuit 94. The first memory bank, $0^{th}$ gated address driver circuit 94 is an example of a differential dynamic circuit. The first memory bank, $0^{th}$ gated address driver circuit 94 receives the DC supply signal $V_{DC}$, the first bank pre-decode clock signal $CLK_{BPD1}$, the $0^{th}$ address signal $ADDR_0$, the $0^{th}$ bank select signal $BNKSEL_0$, and the first bank select signal $BNKSEL_1$, and provides a positive side, first memory bank, $0^{th}$ gated address signal $GADR_{OB1P}$ and a negative side, first memory bank, $0^{th}$ gated address signal $GADR_{OB1N}$. The first memory bank, $0^{th}$ gated address driver circuit 94 includes a sixth NMOS transistor element 128, a seventh NMOS transistor element 130, an eighth NMOS transistor element 132, a ninth NMOS transistor element 134, a tenth NMOS transistor element 136, a second PMOS transistor element 138, a third PMOS transistor element 140, a fourth PMOS transistor element 142, a fifth PMOS transistor element 144, a ninth inverter 146, a tenth inverter 148, an eleventh inverter 150, a twelfth inverter 152, and a thirteenth inverter 154.

A gate of the second PMOS transistor element 138, a gate of the fifth PMOS transistor element 144, and a gate of the sixth NMOS transistor element 128 receive the first bank pre-decode clock signal $CLK_{BPD1}$. A gate of the ninth NMOS transistor element 134 and an input to the ninth inverter 146 receive the $0^{th}$ address signal $ADDR_0$. An input to the twelfth inverter 152 receives the first bank select signal $BNKSEL_1$. An output from the twelfth inverter 152 is coupled to a gate of the eighth NMOS transistor element 132. An input to the thirteenth inverter 154 receives the $0^{th}$ bank select signal $BNKSEL_0$. An output from the thirteenth inverter 154 is coupled to a gate of the seventh NMOS transistor element 130. A source of the sixth NMOS transistor element 128 is coupled to ground. A drain of the sixth NMOS transistor element 128 is coupled to a source of the seventh NMOS transistor element 130. A drain of the seventh NMOS transistor element 130 is coupled to a source of the eighth NMOS transistor element 132. A drain of the eighth NMOS transistor element 132 is coupled to a source of the ninth NMOS transistor element 134 and to a source of the tenth NMOS transistor element 136. An output of the ninth inverter 146 is coupled to a gate of the tenth NMOS transistor element 136. A drain of the ninth NMOS transistor element 134 is coupled to a drain of the second PMOS transistor element 138, a drain of the third PMOS transistor element 140, a gate of the fourth PMOS transistor element 142, and an input to the tenth inverter 148. A drain of the tenth NMOS transistor element 136 is coupled to a drain of the fourth PMOS transistor element 142, a drain of the fifth PMOS transistor element 144, a gate of the third PMOS transistor element 140, and an input to the eleventh inverter 150. Drains of the second, the third, the fourth, and the fifth PMOS transistor elements 138, 140, 142, 144 receive the DC supply signal $V_{DC}$. The output from the tenth inverter 148 provides the positive side, first memory bank, $0^{th}$ gated address signal $GADR_{OB1P}$, and the output from the eleventh inverter 150 provides the negative side, first memory bank, $0^{th}$ gated address signal $GADR_{OB1N}$.

If the first memory bank is the selected memory bank, the first bank pre-decode clock signal $CLK_{BPD1}$ will approximately mirror the first clock signal $CLK_1$. Therefore, during the first phase 68 of the first clock signal $CLK_1$ (FIG. 10A), which selects the pre-charge mode for the first memory bank, $0^{th}$ gated address driver circuit 94, the sixth NMOS transistor element 128 is in an OFF state, thereby isolating the seventh NMOS transistor element 130, the eighth NMOS transistor element 132, the ninth NMOS transistor element 134 and the tenth NMOS transistor element 136, and the second, the third, the fourth, and the fifth PMOS transistor elements 138, 140, 142, 144 are all in an ON state, thereby driving the inputs to the tenth inverter 148 and the eleventh inverter 150 into a HIGH state, which causes the positive side and the negative side, first memory bank, $0^{th}$ gated address signals $GADR_{OB1P}$, $GADR_{OB1N}$ to be driven into a LOW state.

When the first clock signal $CLK_1$ transitions from the first phase 68 to the second phase 70, the first memory bank, $0^{th}$ gated address driver circuit 94 transitions from the pre-charge mode to the evaluate mode. During the evaluate mode, the sixth NMOS transistor element 128 is in an ON state, thereby coupling the seventh NMOS transistor element 130, the eighth NMOS transistor element 132, and the ninth NMOS transistor element 134 between ground and the input to the tenth inverter 148, and coupling the seventh NMOS transistor element 130, the eighth NMOS transistor element 132, and the tenth NMOS transistor element 136 between ground and the input to the eleventh inverter 150. Further, the second PMOS transistor element 138 and the fifth PMOS transistor element 144 are both in an OFF state, which may allow the inputs to the tenth and the eleventh inverters 148, 150 to be driven to a LOW state. However, unless both of the seventh and the eighth NMOS transistor elements 130, 132 are in an ON state, the inputs to the tenth and the eleventh inverters 148, 150 remain in the HIGH state and the positive side and the negative side, first memory bank, $0^{th}$ gated address signals $GADR_{OB1P}$, $GADR_{OB1N}$ remain in the LOW state.

The first memory bank, $0^{th}$ gated address driver circuit 94 is associated with a selected memory bank if both the $0^{th}$ and the first bank select signals $BNKSEL_0$, $BNKSEL_1$ are in a LOW state and the first bank pre-decode clock signal $CLK_{BPD1}$ is transitioning. If such conditions exist, the seventh NMOS transistor element 130 and the eighth NMOS transistor element 132 are both in an ON state, and either the ninth NMOS transistor element 134 or the tenth NMOS transistor element 136 is in an ON state, depending on the state of the $0^{th}$ address signal $ADDR_0$. Therefore, either the positive side, first memory bank, $0^{th}$ gated address signal $GADR_{OB1P}$ is in a HIGH state and the negative side, first memory bank, $0^{th}$ gated address signal $GADR_{OB1N}$ is in a LOW state, or vice versa, depending on the state of the $0^{th}$ address signal $ADDR_0$. The first memory bank, $0^{th}$ gated address driver circuit 94 illustrated in FIG. 13 is an exemplary embodiment of the present disclosure and not intended to limit the scope of the present disclosure.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. A system comprising:
   solid state memory circuitry comprising a plurality of memory banks, which are associated with a plurality of memory accesses, and adapted to receive a plurality of sets of gated address signals, such that each set of gated address signals is associated with a corresponding one of the plurality of memory banks; and
   bank selection and address gating circuitry adapted to:
      during each memory access,
         receive a first clock signal having:
            a first phase;
            a second phase following the first phase; and
            a first transition at the end of the first phase and at the beginning of the second phase;
         receive a first plurality of address signals, which are stable during the first transition; and
         provide the plurality of sets of gated address signals, such that:
            each gated address signal of the plurality of sets of gated address signals does not transition during the first phase;
            one of the plurality of sets of gated address signals is associated with a selected one of the plurality of memory banks and is based on the first plurality of address signals during the first transition; and
            a balance of the plurality of sets of gated address signals is associated with unselected memory banks, such that each gated address signal of the balance of the plurality of sets of gated address signals is prevented from transitioning;
   wherein the one of the plurality of sets of gated address signals provides an address associated with the each memory access.

2. The system of claim 1 wherein the first transition clocks in a status of the first plurality of address signals into the bank selection and address gating circuitry.

3. The system of claim 1 wherein each gated address signal of all of the plurality of sets of gated address signals except the one of the plurality of sets of gated address signals does not transition during the second phase.

4. The system of claim 1 wherein the solid state memory circuitry includes static random access memory (SRAM) circuitry.

5. The system of claim 1 wherein the solid state memory circuitry further comprises memory address decode circuitry adapted to:
receive the plurality of sets of gated address signals; and
provide a plurality of sets of wordlines to the plurality of memory banks, such that:
each set of wordlines is associated with a corresponding one of the plurality of memory banks;
each set of wordlines is based on a corresponding set of the plurality of sets of gated address signals; and
the plurality of memory accesses are based on the plurality of sets of wordlines.

6. The system of claim 5 wherein during the each memory access:
one wordline of the plurality of sets of wordlines transitions from an inactive state to an active state during the second phase; and
all other wordlines of the plurality of sets of wordlines are in the inactive state.

7. The system of claim 6 wherein:
the plurality of memory banks comprises a plurality of sets of bitlines, such that each set of bitlines is associated with a corresponding one of the plurality of memory banks;
during the each memory access, the first clock signal further has a second transition at the end of the second phase; and
the memory address decode circuitry is further adapted to provide a plurality of bitline access signals to the plurality of memory banks, such that:
at least one of the plurality of bitline access signals is associated with a corresponding one of the plurality of memory banks; and
during the each memory access, the at least one of the plurality of bitline access signals associated with the selected one of the plurality of memory banks controls access to the each set of bitlines associated with the selected one of the plurality of memory banks based on the second transition.

8. The system of claim 5 wherein:
the plurality of memory banks comprises a plurality of sets of bitlines, such that each set of bitlines is associated with a corresponding one of the plurality of memory banks;
during the each memory access, the first clock signal further has a second transition at the end of the second phase; and
the memory address decode circuitry is further adapted to provide a plurality of bitline access signals to the plurality of memory banks, such that:
at least one of the plurality of bitline access signals is associated with a corresponding one of the plurality of memory banks; and
during the each memory access, the at least one of the plurality of bitline access signals associated with the selected one of the plurality of memory banks controls access to the each set of bitlines associated with the selected one of the plurality of memory banks based on the second transition.

9. The system of claim 8 wherein the bank selection and address gating circuitry comprises a plurality of differential dynamic circuits adapted to:
receive the first clock signal and the first plurality of address signals;
provide the plurality of sets of gated address signals; and
operate in one of a pre-charge mode and an evaluate mode.

10. The system of claim 5 wherein the bank selection and address gating circuitry comprises a plurality of differential dynamic circuits adapted to:
receive the first clock signal and the first plurality of address signals;
provide the plurality of sets of gated address signals; and
operate in one of a pre-charge mode and an evaluate mode.

11. The system of claim 10 wherein the plurality of differential dynamic circuits is further adapted to:
operate in the pre-charge mode during the first phase; and
operate in the evaluate mode during the second phase.

12. The system of claim 1 wherein the bank selection and address gating circuitry is further adapted to during each memory access receive at least one bank select signal, such that selection of the selected one of the plurality of memory banks is based on the at least one bank select signal.

13. The system of claim 12 wherein the at least one bank select signal is based on a second plurality of address signals.

14. The system of claim 13 wherein the second plurality of address signals are high order address signals.

15. The system of claim 12 further comprising memory control circuitry adapted to:
control the plurality of memory accesses to the solid state memory circuitry;
during the each memory access, provide the first clock signal;
during the each memory access, provide the first plurality of address signals; and
during the each memory access, provide the at least one bank select signal.

16. The system of claim 15 wherein the at least one bank select signal is based on a second plurality of address signals.

17. The system of claim 12 wherein the bank selection and address gating circuitry comprises:
a plurality of bank pre-decode circuits adapted to:
receive the first clock signal;
receive at least one of the at least one bank select signal; and
during the each memory access, provide a plurality of clock signals based on the first clock signal and the at least one of the at least one bank select signal, such that:
a selected one of the plurality of clock signals is associated with the selected one of the plurality of memory banks; and
all except the selected one of the plurality of clock signals does not transition during the each memory access; and
a plurality of address driver circuits adapted to:
receive the plurality of clock signals;
receive the first plurality of address signals; and
during the each memory access, provide the plurality of sets of gated address signals based on the plurality of clock signals and the first plurality of address signals.

18. The system of claim 17 wherein the plurality of address driver circuits is further adapted to:
receive at least another of the at least one bank select signal; and
during the each memory access, provide the plurality of sets of gated address signals further based on the at least another of the at least one bank select signal.

19. The system of claim 17 wherein each of the plurality of address driver circuits is a differential dynamic circuit adapted to operate in one of a pre-charge mode and an evaluate mode and each of the plurality of bank pre-decode circuits is a dynamic circuit adapted to operate in one of the pre-charge mode and the evaluate mode.

20. A method comprising:
- receiving a plurality of sets of gated address signals, such that each set of gated address signals is associated with a corresponding one of a plurality of memory banks, which are associated with a plurality of memory accesses;
- receiving a first clock signal having:
  - a first phase;
  - a second phase following the first phase; and
  - a first transition at the end of the first phase and at the beginning of the second phase;
- receiving a first plurality of address signals, which are stable during the first transition; and
- providing the plurality of sets of gated address signals, such that:
  - each gated address signal of the plurality of sets of gated address signals does not transition during the first phase;
  - one of the plurality of sets of gated address signals is associated with a selected one of the plurality of memory banks and is based on the first plurality of address signals during the first transition; and
  - a balance of the plurality of sets of gated address signals is associated with unselected memory banks, such that each gated address signal of the balance of the plurality of sets of gated address signals is prevented from transitioning;

wherein the one of the plurality of sets of gated address signals provides an address associated with the each memory access.

* * * * *